(12) United States Patent
Kikumoto

(10) Patent No.: US 10,229,846 B2
(45) Date of Patent: Mar. 12, 2019

(54) SUBSTRATE PROCESSING APPARATUS

(71) Applicant: SCREEN Holdings Co., Ltd., Kyoto (JP)

(72) Inventor: Noriyuki Kikumoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 95 days.

(21) Appl. No.: 15/107,035

(22) PCT Filed: Dec. 17, 2014

(86) PCT No.: PCT/JP2014/083426
§ 371 (c)(1),
(2) Date: Jun. 21, 2016

(87) PCT Pub. No.: WO2015/098655
PCT Pub. Date: Jul. 2, 2015

(65) Prior Publication Data
US 2017/0040188 A1     Feb. 9, 2017

(30) Foreign Application Priority Data

Dec. 25, 2013  (JP) .................................. 2013-267484
Mar. 27, 2014  (JP) .................................. 2014-065242

(51) Int. Cl.
*H01L 21/67*     (2006.01)
*H01L 21/687*    (2006.01)

(52) U.S. Cl.
CPC ...... *H01L 21/6719* (2013.01); *H01L 21/6708* (2013.01); *H01L 21/67126* (2013.01); *H01L 21/68721* (2013.01); *H01L 21/68742* (2013.01)

(58) Field of Classification Search
CPC ......... H01L 21/67017; H01L 21/67023; H01L 21/67028; H01L 21/6704; H01L 21/67051;
(Continued)

(56) References Cited

U.S. PATENT DOCUMENTS 7,802,536 B2 *  9/2010  Yoshihara ............... G03F 7/162
                                                    118/320
2001/0009135 A1  7/2001  Hasebe et al. ................ 118/52
(Continued)

FOREIGN PATENT DOCUMENTS

CN     1735467 A     2/2006
CN     101615567 A   12/2009
(Continued)

OTHER PUBLICATIONS

International Search Report and Written Opinion dated Mar. 17, 2015 in corresponding PCT International Application No. PCT/JP2014/083426.
(Continued)

*Primary Examiner* — David G Cormier
(74) *Attorney, Agent, or Firm* — Ostrolenk Faber LLP

(57) ABSTRACT

In a substrate processing apparatus, a chamber lid and a cup are located at a first position, a cup side wall and a liquid receiving side wall overlap each other in a radial direction, and a guard is supported by a liquid receiving side wall. When the chamber lid and the cup move to a second position that is above the first position, the guard moves upward while being suspended from the cup side wall. When the chamber lid and the cup are located at the second position, the lower end of the cup side wall is located above the upper end of the liquid receiving side wall, and the guard covers a gap between the lower end of the cup side wall and the upper end of the liquid receiving side wall.

12 Claims, 14 Drawing Sheets

(58) Field of Classification Search
CPC ............. H01L 21/6708; H01L 21/6719; H01L 21/67126; H01L 21/6715; H01L 21/68714; H01L 21/68721; H01L 21/68742
See application file for complete search history.

(56) References Cited

U.S. PATENT DOCUMENTS

| | | | |
|---|---|---|---|
| 2003/0098048 A1 | 5/2003 | Kuroda et al. | 134/32 |
| 2003/0172955 A1 | 9/2003 | Kuroda et al. | 134/2 |
| 2004/0050491 A1 | 3/2004 | Miya et al. | 156/345.11 |
| 2004/0094183 A1 | 5/2004 | Ching et al. | 134/1.3 |
| 2009/0320885 A1 | 12/2009 | Inoue et al. | 134/104.2 |
| 2011/0240601 A1 | 10/2011 | Hashizume et al. | 216/83 |
| 2012/0180828 A1 | 7/2012 | Higashijima et al. | 134/198 |
| 2014/0060423 A1 | 3/2014 | Nakai et al. | 118/50 |
| 2014/0227883 A1 | 8/2014 | Izumoto et al. | 438/745 |
| 2014/0273498 A1 | 9/2014 | Kobayashi et al. | 438/745 |
| 2014/0290703 A1 | 10/2014 | Kobayashi et al. | 134/33 |

FOREIGN PATENT DOCUMENTS

| | | |
|---|---|---|
| EP | 1 061 557 | 6/2000 |
| JP | 2001-110714 | 4/2001 |
| JP | 2003-031548 | 1/2003 |
| JP | 2003-224100 A | 8/2003 |
| JP | 2005-079220 A | 3/2005 |
| JP | 2009-147152 | 7/2009 |
| JP | 2010-010555 | 1/2010 |
| JP | 2011-216607 | 10/2011 |
| JP | 2014-067778 | 4/2014 |
| JP | 2014-067780 | 4/2014 |
| JP | 2014-154858 | 8/2014 |
| JP | 2014-157901 | 8/2014 |
| JP | 2014-179489 | 9/2014 |
| JP | 2014-179490 | 9/2014 |
| JP | 2014-194965 | 10/2014 |
| JP | 2016-063049 | 4/2016 |
| KR | 10-0897431 | 6/2003 |
| KR | 10-0914764 | 8/2003 |
| KR | 10-0994497 | 11/2010 |
| KR | 10-2012-0083841 | 7/2012 |
| WO | WO 2004/045739 | 6/2004 |

OTHER PUBLICATIONS

Notification Concerning Transmitaal of International Preliminary Report on Patentability including PCT/IB/373 and PCT/ISA/237 (in Japanese) dated Jul. 11, 2016.
Notification of Transmittal of Translation of the International Preliminary Report on Patentability including PCT/IB/373 and PCT/ISA/237 (in English) dated Jul. 11, 2016.

* cited by examiner

SUBSTRATE PROCESSING APPARATUS

CROSS-REFERENCE TO RELATED APPLICATIONS

The present application is a 35 U.S.C. §§ 371 national phase conversion of PCT/JP2014/083426, filed Dec. 17, 2014, which claims priority to Japanese Patent Application Nos. 2013-267484 and 2014-065242, filed Dec. 25, 2013 and Mar. 27, 2014, respectively, the contents of all of which are incorporated herein by reference. The PCT International Application was published in the Japanese language.

TECHNICAL FIELD

The present invention relates to a substrate processing apparatus for processing substrates.

BACKGROUND ART

A process of manufacturing semiconductor substrates (hereinafter, simply referred to as "substrates") conventionally involves various types of processing that is performed on substrates by various types of substrate processing apparatuses. For example, processing such as etching is performed on a surface of a substrate having a resist pattern on the surface by supplying a chemical solution to the substrate. After the etching process ends, processing such as removing the resist on the substrate or cleaning the substrate is also performed.

In a chemical liquid coating apparatus disclosed in Japanese Patent Application Laid-Open No. 2001-110714 (Document 1), for example, a tubular shield member is disposed below the outer edge portion of a wafer. When a resist liquid is applied to the upper surface of the wafer, the shield member moves upward so that the upper end of the shield member comes close to the lower surface of the wafer. The distance between the upper end of the shield member and the lower surface of the wafer is several millimeters. This configuration suppresses the spread of droplets of the resist to the lower surface of the wafer.

In a substrate processing apparatus disclosed in Japanese Patent Application Laid-Open No. 2010-10555 (Document 2), a cup body that receives a processing liquid dispersed from a substrate is provided around a rotary table that holds the substrate. Also, a movable parting body that is movable in the up-down direction is provided between the rotary table and the cup body. In a state in which the movable parting body is moved upward and located around the rotary table, the processing liquid dispersed from the substrate is received by the movable parting body.

Depending on the type of processing, substrate processing apparatuses are sometimes required to perform processing in a sealed space. A substrate processing apparatus disclosed in Japanese Patent Application Laid-Open No. 2011-216607 (Document 3) includes a sealed chamber constituted by a chamber body and a lid member. The chamber body and the lid member are not in contact with each other, and a liquid sealing structure is provided between the chamber body and the lid member. The lid member is rotatable relative to the chamber body, and the rotation of the lid member stabilizes airflow above the substrate while reducing the capacity of the sealed space.

In the case where processing using a processing liquid is performed on a substrate in a low oxygen atmosphere, it is conceivable to house the substrate in a sealed space formed in a substrate processing apparatus and supply the processing liquid to the substrate in, for example, an inert gas atmosphere that is created in the sealed space. In this case, the processing liquid dispersed from the substrate that is being rotated is received by a cup part provided on the inner side of a sealed-space forming member that forms the sealed space. The processing liquid that is not received by the cup part adheres to the outer side wall part of the sealed-space forming member located around the cup part. The processing liquid adhering to the outer side wall part may generate particles as a result of drying, or may leak out to the outside of the sealed space from the lower end of the outer side wall part.

In the apparatus of Document 3, the boundary between the lid member and the chamber body is visible from the substrate side. Thus, the processing liquid may enter this boundary, and the solidified processing liquid may become a source of particles. If the chamber height is to be reduced to a minimum, the position of the boundary between the lid member and the chamber body becomes lower and is thereby more exposed to the processing liquid. In addition, the apparatus of Document 3 is not suitable for recovery of spent processing liquids because all processing liquids similarly flow down in the chamber.

SUMMARY OF INVENTION

The present invention is intended for a substrate processing apparatus, and it is an object of the present invention to suppress adhesion of a processing liquid to the outer side wall part. The present invention also aims to suppress generation of particles and achieve recovery of processing liquids while reducing the size of the chamber.

A substrate processing apparatus according to the present invention includes a space forming main body having a tubular main body side wall part, a space forming lid part having a tubular lid side wall part located on a radially inner side of the main body side wall part and for covering a top of the space forming main body, a space-forming-part movement mechanism for moving the space forming lid part relative to the space forming main body in an up-down direction between a first position and a second position that is above the first position, an outer side wall part located on a radially outer side of the main body side wall part, having an upper end portion connected to the space forming lid part and a lower end portion connected to the space forming main body, and becoming deformed following the relative movement caused by the space-forming-part movement mechanism, a tubular guard part disposed between the lid side wall part and the main body side wall part, a substrate supporter disposed within the space forming main body and for holding a substrate in a horizontal position, a substrate rotation mechanism for rotating the substrate along with the substrate supporter, and a processing liquid supply part for supplying a processing liquid to the substrate. In a state in which the space forming lid part is located at the first position, the lid side wall part and the main body side wall part overlap each other in a radial direction, and the guard part is supported by the main body side wall part. When the space forming lid part moves from the first position to the second position, the guard part moves upward along with the movement of the space forming lid part. In a state in which the space forming lid part is located at the second position, a lower end of the lid side wall part is located above an upper end of the main body side wall part, and the guard part covers a gap between the lower end of the lid side wall part and the upper end of the main body side wall part. This substrate processing apparatus can suppress adhesion of the processing liquid to the outer side wall part.

In a preferred embodiment of the present invention, when the space forming lid part moves from the first position to the second position, the guard part moves upward while being suspended from the lid side wall part.

In another preferred embodiment of the present invention, the outer side wall part is a bellows in which a plurality of peripherally extending mountain-fold lines and a plurality of peripherally extending valley-fold lines are alternately arranged in the up-down direction.

In another preferred embodiment of the present invention, in the state in which the space forming lid part is located at the second position, a lower end portion of the guard part overlaps with an upper end portion of the main body side wall part in the radial direction.

In another preferred embodiment of the present invention, the space forming lid part has a tubular inner lid side wall part located on a radially inner side of the lid side wall part. In the state in which the space forming lid part is located at the first position, the inner lid side wall part is in contact with the space forming main body, forming an internal sealed space. In the state in which the space forming lid part is located at the second position, the inner lid side wall part is spaced from the space forming main body, forming an annular opening between the inner lid side wall part and the space forming main body, and the lid side wall part receives a processing liquid dispersed from the substrate through the annular opening.

More preferably, the processing liquid supply part includes a nozzle that is attached to the space forming lid part between the inner lid side wall part and the lid side wall part and moves to above the substrate through the annular opening to supply the processing liquid to the substrate.

Another substrate processing apparatus according to the present invention includes a chamber including a chamber body and a chamber lid part and forming a chamber space in a chamber closed state in which the chamber lid part is in close proximity to or in contact with an upper opening of the chamber body, a chamber opening-and-closing mechanism for moving the chamber lid part relative to the chamber body in an up-down direction, a substrate holder located in the chamber space in the chamber closed state and for holding a substrate in a horizontal position, a substrate rotation mechanism for rotating the substrate along with the substrate holder about a central axis pointing in the up-down direction, a processing liquid ejection part for supplying a processing liquid to the substrate, and a cup part located outside the chamber throughout a periphery thereof, forming a lateral space along the periphery of the chamber, and receiving a processing liquid dispersed from the substrate that is being rotated, through an annular opening that is formed around the substrate by spacing the chamber lid part from the chamber body. A lower portion of the chamber lid part includes a lower protruding part that protrudes downward throughout a periphery thereof. In the chamber closed state, a lower end of the lower protruding part is located below the substrate held by the substrate holder, and the lower protruding part covers a radially inner side of a gap or boundary between the chamber lid part and the chamber body. An area that includes the chamber body, the chamber lid part, and the cup part forms one enlarged sealed space when the cup part is in contact with the chamber lid part in a state in which the annular opening is formed. This substrate processing apparatus can suppress generation of particles and achieve recovery of the processing liquid while reducing the size of the chamber.

In a preferred embodiment of the present invention, the chamber lid part includes an annular recessed part that is located above the lower protruding part and recessed radially outward, and in the chamber closed state, the annular recessed part is located laterally to the substrate held by the substrate holder.

In another preferred embodiment of the present invention, the chamber body includes an upper protruding part that protrudes upward on a radially outer side of the lower protruding part throughout a periphery thereof, and an upper end of the upper protruding part is tapered upward.

In another preferred embodiment of the present invention, the substrate processing apparatus further includes a first discharge passage for discharging gas in the cup part, and a second discharge passage for discharging gas in the chamber. The discharge of gas from the first discharge passage is stopped when the chamber body and the chamber lid part are in close proximity to each other without being in contact with each other in the chamber closed state and a processing liquid is supplied to the substrate that is being rotated.

In another preferred embodiment of the present invention, the chamber body includes an upper protruding part that protrudes upward on a radially outer side of the lower protruding part. In the chamber closed state, an upper end of the upper protruding part is in contact with the chamber lid part, and an upper portion of the upper protruding part or an area of the chamber lid part that is in contact with an upper end of the upper protruding part includes an elastic seal member.

In another preferred embodiment of the present invention, the substrate processing apparatus further includes a cup-part movement mechanism for moving the cup part in the up-down direction. A position of the chamber body is fixed, and a position of the cup part when a substrate is conveyed in between the chamber body and the chamber lid part is lower than a position of the cup part in a state in which the enlarged sealed space is formed.

These and other objects, features, aspects and advantages of the present invention will become more apparent from the following detailed description of the present invention when taken in conjunction with the accompanying drawings.

DESCRIPTION OF EMBODIMENTS

Figure 1:
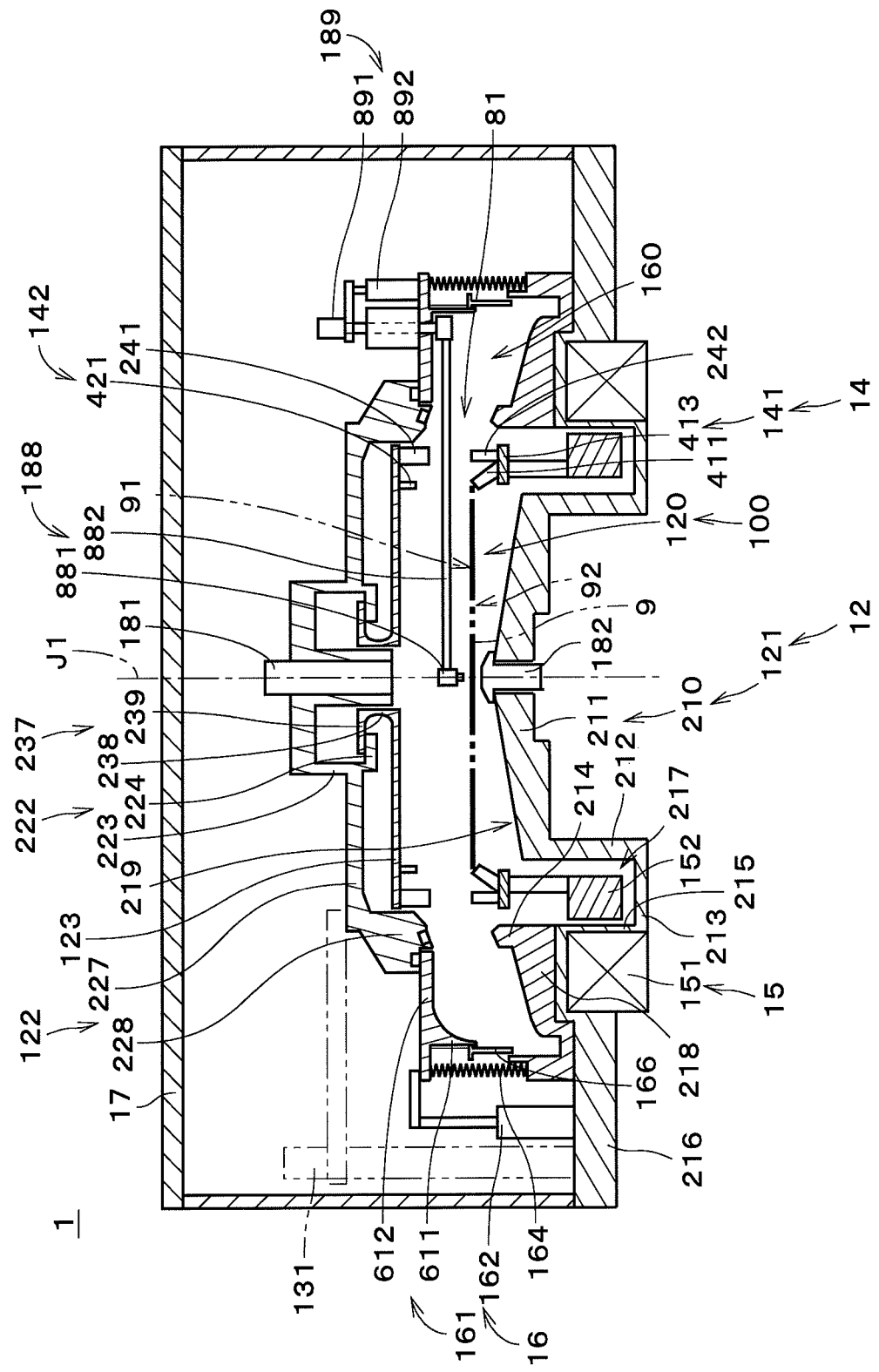
FIG. 1 is a cross-sectional view of a substrate processing apparatus according to a first embodiment.

FIG. 1 is a cross-sectional view of a substrate processing apparatus 1 according to a first embodiment of the present invention. The substrate processing apparatus 1 is a single wafer processing apparatus for processing generally disc-shaped semiconductor substrates 9 (hereinafter, simply referred to as "substrates 9") one at a time by supplying a processing liquid to the substrates 9. FIG. 1 omits illustration of cross-hatching of cross sections for some constituent elements of the substrate processing apparatus 1 (the same applies to the other cross-sectional views).

The substrate processing apparatus 1 includes a chamber 12, a top plate 123, a chamber opening-and-closing mechanism 131, a substrate holder 14, a substrate rotation mechanism 15, a liquid receiving part 16, an outer side wall part 164, a guard part 166, and a cover 17. The cover 17 covers the top and sides of the chamber 12.

The chamber 12 includes a chamber body 121 and a chamber lid part 122. The chamber 12 has a generally cylindrical shape centered on a central axis J1 pointing in an up-down direction. The chamber body 121 includes a chamber bottom part 210, a chamber side wall part 214, and a cup opposing part 218. The chamber bottom part 210 includes a generally disc-shaped bottom central part 211, a generally cylindrical bottom inner side wall part 212 that extends downward from the outer edge portion of the bottom central part 211, an annular bottom part 213 that has a generally annular plate-like shape and extends radially outward from the lower end of the bottom inner side wall part 212, a generally cylindrical bottom outer side wall part 215 that extends upward from the outer edge portion of the annular bottom part 213, and a generally annular plate-like base part 216 that extends radially outward from the upper end of the bottom outer side wall part 215.

The chamber side wall part 214 has a generally cylindrical shape centered on the central axis J1. The chamber side wall part 214 protrudes upward from the inner edge portion of the base part 216. The cup opposing part 218 has a generally annular shape centered on the central axis J1. The cup opposing part 218 extends radially outward from the lower end of the chamber side wall part 214. In the example illustrated in FIG. 1, the chamber side wall part 214 and the cup opposing part 218 are constituted by a single member. In the following description, the space surrounded by the chamber side wall part 214, the bottom outer side wall part 215, the annular bottom part 213, the bottom inner side wall part 212, and the outer edge portion of the bottom central part 211 is referred to as a "lower annular space 217."

When the substrate 9 is supported by a substrate supporter 141 (described later) of the substrate holder 14, a lower surface 92 of the substrate 9 opposes the upper surface of the bottom central part 211 of the chamber bottom part 210. In the following description, the bottom central part 211 of the chamber bottom part 210 is referred to as a "lower-surface opposing part 211," and an upper surface 219 of the bottom central part 211 is referred to as an "opposing surface 219." The opposing surface 219 of the lower-surface opposing part 211 has water repellency. The opposing surface 219 may, for example, be made of a fluorocarbon resin such as Teflon (registered trademark). The opposing surface 219 is an inclined surface that is inclined downward outwardly in the radial direction from the central axis J1, and forms part of a generally circular conical surface centered on the central axis J1.

The chamber lid part 122 has a generally cylindrical covered shape perpendicular to the central axis J1, and includes an upper portion of the chamber 12. The chamber lid part 122 includes a generally disc-shaped canopy part 227, and a generally cylindrical lid lower tubular part 228 that extends downward from the outer edge portion of the canopy part 227. The chamber lid part 122 closes the upper opening of the chamber body 121. FIG. 1 illustrates a state in which the chamber lid part 122 is spaced from the chamber body 121. When the chamber lid part 122 closes the upper opening of the chamber body 121, the lower end portion of the lid lower tubular part 228 is in contact with the upper portion of the chamber side wall part 214.

Figure 9:
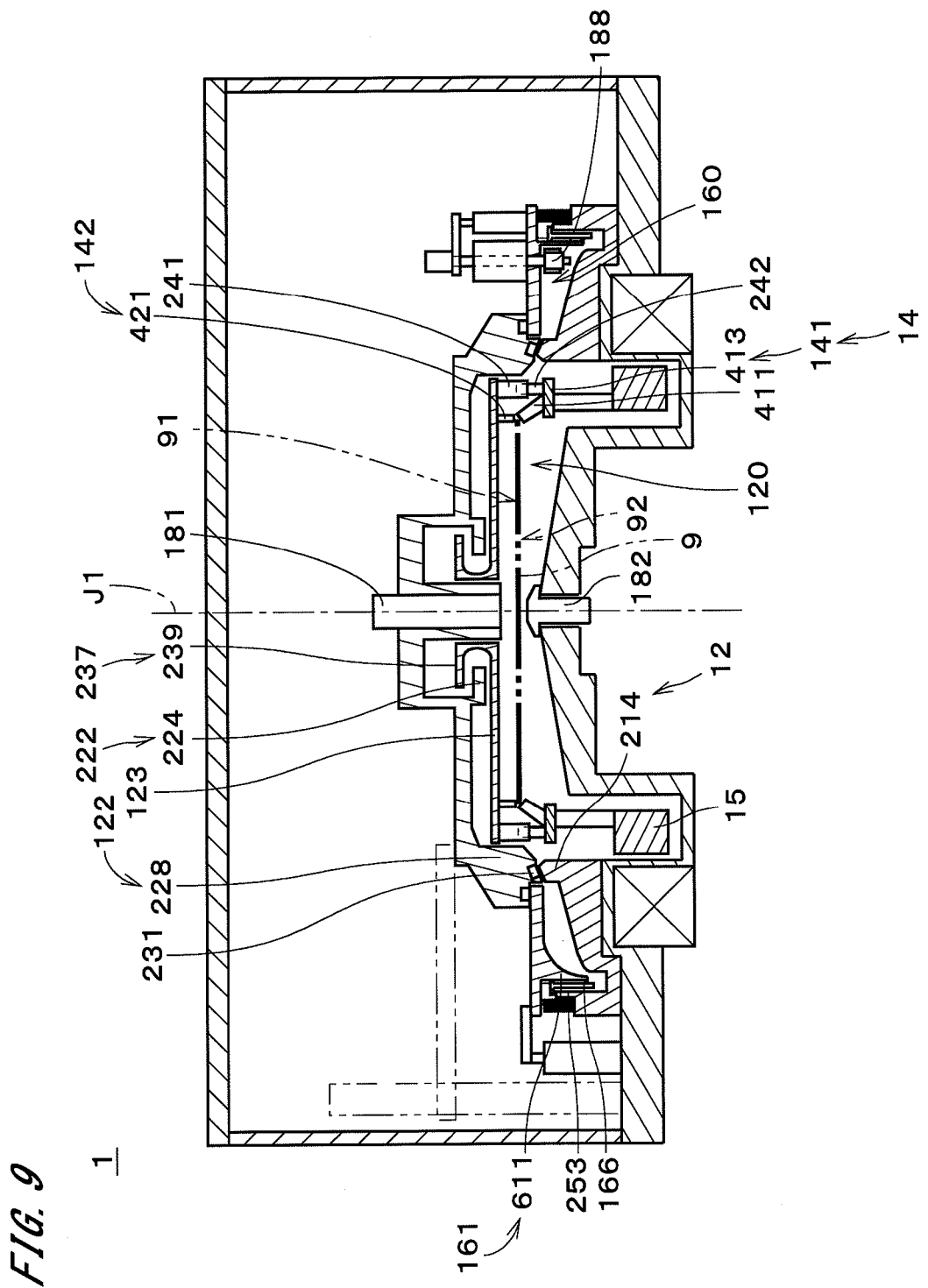
FIG. 9 is a cross-sectional view of the substrate processing apparatus.

The chamber opening-and-closing mechanism 131 moves the chamber lid part 122 relative to the chamber body 121 in the up-down direction, the chamber lid part 122 being a movable part of the chamber 12, and the chamber body 121 being the other part of the chamber 12 other than the chamber lid part 122. The chamber opening-and-closing mechanism 131 is a lid elevating mechanism for moving the chamber lid part 122 up and down. When the chamber lid part 122 is moved in the up-down direction by the chamber opening-and-closing mechanism 131, the top plate 123 is also moved along with the chamber lid part 122 in the up-down direction. When the lid lower tubular part 228 of the chamber lid part 122 comes in contact with the chamber side wall part 214 of the chamber body 121 to close the upper opening and push the chamber lid part 122 against the chamber body 121, a chamber space 120 that is a sealed space is formed in the chamber 12 as illustrated in FIG. 9, which will be described later.

The substrate holder 14 illustrated in FIG. 1 is disposed in the chamber space 120, which is the space between the chamber lid part 122 and the chamber body 121, and holds the substrate 9 in a horizontal position. That is, the substrate 9 is held by the substrate holder 14 with its upper surface 91 facing up perpendicularly to the central axis J1. The substrate holder 14 includes a substrate supporter 141 and a substrate pressing part 142. The substrate supporter 141 is disposed within the chamber body 121 and supports the outer edge portion (i.e., an area including and in the vicinity of the outer peripheral edge) of the substrate 9 held in a horizontal position from the underside. The substrate pressing part 142 presses the outer edge portion of the substrate 9 supported by the substrate supporter 141 from above. In the state illustrated in FIG. 1, the substrate pressing part 142 is not used.

The substrate supporter 141 is a generally annular member centered on the central axis J1. The aforementioned lower-surface opposing part 211 is disposed on the radially inner side of the substrate supporter 141. The substrate supporter 141 includes a generally annular plate-like supporter base 413 centered on the central axis J1, and a plurality of first contact parts 411 that are fixed to the upper surface of the supporter base 413. The substrate pressing part 142 includes a plurality of second contact parts 421 that are fixed to the lower surface of the top plate 123. In actuality, the circumferential positions of the second contact parts 421 differ from the circumferential positions of the first contact parts 411.

The top plate 123 has a generally disc shape perpendicular to the central axis J1. The top plate 123 is disposed below the chamber lid part 122 and above the substrate supporter 141. The top plate 123 has an opening at the center. When the substrate 9 is supported by the substrate supporter 141, the upper surface 91 of the substrate 9 opposes the lower surface of the top plate 123 that is perpendicular to the central axis J1. The top plate 123 has a larger diameter than the substrate 9, and the outer peripheral edge of the top plate 123 is located on the radially outer side of the entire outer peripheral edge of the substrate 9.

In the state illustrated in FIG. 1, the top plate 123 is suspended from and supported by the chamber lid part 122. The chamber lid part 122 includes a generally annular plate holder 222 in the central portion. The plate holder 222 includes a generally cylindrical tubular part 223 centered on the central axis J1 and a generally disc-shaped flange part 224 centered on the central axis J1. The flange part 224 extends radially inward from the lower end of the tubular part 223.

The top plate 123 includes a held part 237 having an annular shape. The held part 237 includes a generally cylindrical tubular part 238 centered on the central axis J1 and a generally disc-shaped flange part 239 centered on the central axis J1. The tubular part 238 extends upward from the upper surface of the top plate 123. The flange part 239 extends radially outward from the upper end of the tubular part 238. The tubular part 238 is located on the radially inner side of the tubular part 223 of the plate holder 222. The flange part 239 is located above the flange part 224 of the plate holder 222 and opposes the flange part 224 in the up-down direction. When the lower surface of the flange part 239 of the held part 237 comes in contact with the upper surface of the flange part 224 of the plate holder 222, the top plate 123 is attached to the chamber lid part 122 so as to be suspended from the chamber lid part 122.

The lower surface of the outer edge portion of the top plate 123 has a plurality of first engagement parts 241 arranged in the circumferential direction, and the upper surface of the supporter base 413 has a plurality of second engagement parts 242 arranged in the circumferential direction. In actuality, the first engagement parts 241 and the second engagement parts 242 are disposed at different circumferential positions from the first contact parts 411 of the substrate supporter 141 and the second contact parts 421 of the substrate pressing part 142. Preferably, there are three or more sets of these engagement parts, and four sets of engagement parts are provided in the present embodiment. Each first engagement part 241 has an upwardly recessed portion at the bottom. The second engagement parts 242 protrude upward from the supporter base 413.

The substrate rotation mechanism 15 illustrated in FIG. 1 is a so-called hollow motor. The substrate rotation mechanism 15 includes an annular stator 151 centered on the central axis J1, and an annular rotor 152. The rotor 152 includes a generally annular permanent magnet. The surface of the permanent magnet is molded of a PTFE resin. The rotor 152 is disposed in the lower annular space 217 of the chamber space 120 of the chamber 12. The supporter base 413 of the substrate supporter 141 is attached to the upper portion of the rotor 152 via a connection member. The supporter base 413 is disposed above the rotor 152.

The stator 151 is disposed around the rotor 152 outside the chamber 12. In other words, the stator 151 is disposed on the radially outer side of the rotor 152 outside the chamber space 120. In the present embodiment, the stator 151 is fixed to the bottom outer side wall part 215 and the base part 216 of the chamber bottom part 210 and located below the liquid receiving part 16. The stator 151 includes a plurality of coils arranged in the circumferential direction about the central axis J1.

Supplying current to the stator 151 produces a torque about the central axis J1 between the stator 151 and the rotor 152. This causes the rotor 152 to rotate in a horizontal position about the central axis J1. The magnetic force acting between the stator 151 and the rotor 152 allows the rotor 152 to float in the chamber 12 without being in direct or indirect contact with the chamber 12 and rotate the substrate 9 along with the substrate supporter 141 of the substrate holder 14 about the central axis J1 in a floating state.

The liquid receiving part 16 includes a cup part 161 and a cup-part movement mechanism 162. The cup part 161 has an annular shape centered on the central axis J1 and is located on the radially outer side of the chamber 12 throughout the periphery thereof. The cup-part movement mechanism 162 moves the cup part 161 in the up-down direction. In other words, the cup-part movement mechanism 162 moves the cup part 161 relative to the chamber body 121 in the up-down direction. The cup-part movement mechanism 162 is disposed on the radially outer side of the cup part 161. The cup-part movement mechanism 162 is disposed at a different circumferential position from the aforementioned chamber opening-and-closing mechanism 131.

The cup part 161 includes a cup side wall part 611 and a cup upper surface part 612. The cup side wall part 611 has a generally cylindrical shape centered on the central axis J1. The cup upper surface part 612 has a generally annular plate-like shape centered on the central axis J1 and extends radially inward and outward from the upper end portion of the cup side wall part 611. The cross-sectional shape of the cup side wall part 611 differs between an area where a scan nozzle 188, which will be described later, is housed (the area on the right side in FIG. 1) and the other area (the area on the left side in FIG. 1). The right-side area of the cup side wall part 611 in FIG. 1 has a slightly smaller radial thickness than the radial thickness of the left-side area in FIG. 1.

The guard part 166 has a generally cylindrical shape centered on the central axis J1. The guard part 166 is located on the radially outer side of the cup side wall part 611. The guard part 166 is suspended from the cup side wall part 611. The cup part 161 and the guard part 166 are located above the cup opposing part 218 and opposes the cup opposing part 218 in the up-down direction.

The outer side wall part 164 has a generally cylindrical shape centered on the central axis J1 and is extendable in the up-down direction. In the example illustrated in FIG. 1, the outer side wall part 164 is a bellows in which a plurality of peripherally extending mountain-fold lines and a plurality of peripherally extending valley-fold lines are alternately arranged in the up-down direction. In the following description, the outer side wall part 164 is referred to as the "bellows 164." The bellows 164 is located on the radially outer side of the chamber side wall part 214, the cup opposing part 218, the cup side wall part 611, and the guard part 166, and is provided around the chamber side wall part 214, the cup opposing part 218, the cup side wall part 611, and the guard part 166 throughout the peripheries thereof. The bellows 164 is made of a material that prevents passage of gas and liquid.

The upper end of the bellows 164 is connected to the lower surface of the outer edge portion of the cup upper surface part 612 of the cup part 161 throughout the periphery thereof. In other words, the upper end of the bellows 164 is indirectly connected to the cup side wall part 611 via the cup upper surface part 612. The connection between the bellows 164 and the cup upper surface part 612 is sealed to prevent passage of gas. The lower end of the bellows 164 is connected to the outer edge portion of the cup opposing part 218 throughout the periphery thereof. In other words, the lower end of the bellows 164 is indirectly connected to the chamber body 121 via the cup opposing part 218. The connection between the lower end of the bellows 164 and the cup opposing part 218 also prevents passage of gas. The bellows 164 becomes deformed following the movement of the cup part 161 caused by the cup-part movement mechanism 162 (i.e., relative movement of the cup opposing part 218 of the cup part 161 and the chamber body 121), and the height of the bellows 164 in the up-down direction changes.

Figure 2:
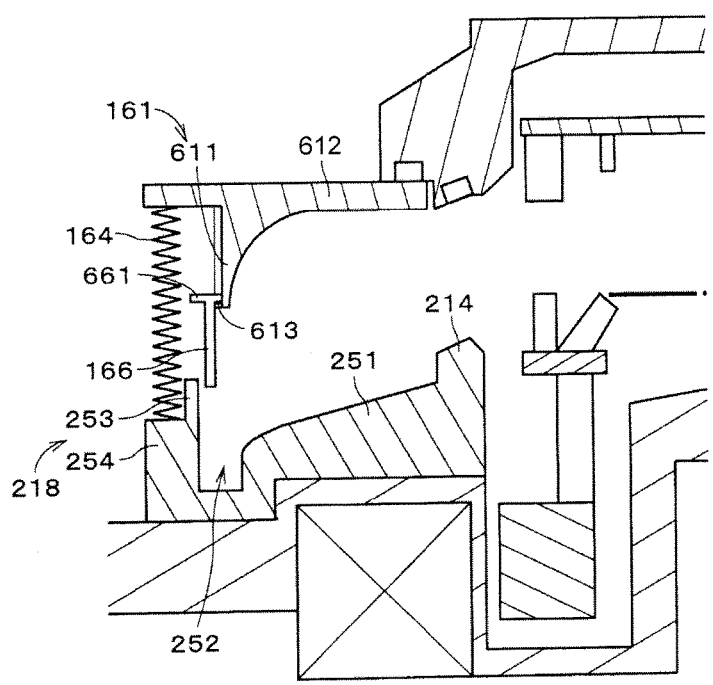
FIG. 2 is an enlarged cross-sectional view of the vicinity of a bellows.

FIG. 2 is an enlarged partial cross-sectional view of the bellows 164 and the vicinity thereof. As illustrated in FIG. 2, the cup opposing part 218 includes an inclined bottom part 251, a liquid receiving side wall part 253, and a bellows fixing part 254. The inclined bottom part 251 has a generally annular plate-like shape centered on the central axis J1 (see FIG. 1) and extends radially outward from the chamber side wall part 214. The upper surface of the inclined bottom part 251 is an inclined surface that is inclined downward outwardly in the radial direction. The liquid receiving side wall part 253 has a generally cylindrical shape centered on the central axis J1 and is disposed on the outer side of the inclined bottom part 251 in the circumferential direction. The upper end of the liquid receiving side wall part 253 may, for example, be located above the outer and inner edges of the upper surface of the inclined bottom part 251.

A generally annular liquid receiving recessed part 252 centered on the central axis J1 is provided between the inclined bottom part 251 and the liquid receiving side wall part 253. The bottom surface of the liquid receiving recessed part 252 is located below the outer edge of the upper surface of the inclined bottom part 251. The bellows fixing part 254 has a generally cylindrical shape centered on the central axis J1. The bellows fixing part 254 is located on the radially outer side of the liquid receiving side wall part 253. The upper end of the bellows fixing part 254 is fixed to the lower end of the bellows 164.

The cup side wall part 611 and the guard part 166 are located above the liquid receiving recessed part 252. In other words, the cup side wall part 611 and the guard part 166 oppose the liquid receiving recessed part 252 in the up-down direction. The cup side wall part 611 and the guard part 166 are located on the radially inner side of the liquid receiving side wall part 253. The cup side wall part 611 is located on the radially inner side of the guard part 166. That is, the guard part 166 is disposed between the liquid receiving side wall part 253 and the cup side wall part 611 in the radial direction.

In the state illustrated in FIG. 2, a flange part 661 that extends radially inward and outward from the upper end portion of the guard part 166 is supported by a flange part 613 that extends radially outward from the lower end portion of the cup side wall part 611, and the guard part 166 is suspended from the cup side wall part 611. The lower end of the cup side wall part 611 is located above the upper end of the liquid receiving side wall part 253. The guard part 166 extends downward below the lower end of the cup side wall part 611. The guard part 166 covers a gap between the lower end of the cup side wall part 611 and the upper end of the liquid receiving side wall part 253. This prevents the bellows 164 from directly opposing in the radial direction the space on the radially inner side of the cup side wall part 611, the guard part 166, and the liquid receiving side wall part 253. The lower end of the guard part 166 is preferably located below the upper end of the liquid receiving side wall part 253. In other words, the lower end portion of the guard part 166 preferably overlaps the upper end portion of the liquid receiving side wall part 253 in the radial direction.

As illustrated in FIG. 1, the scan nozzle 188 is attached to the cup upper surface part 612 of the cup part 161. In other words, the scan nozzle 188 is attached to the cup part 161 between the lid lower tubular part 228 and the cup side wall part 611. The scan nozzle 188 includes an ejection head 881 for ejecting a processing liquid and a head supporter 882. The head supporter 882 is a rod-like member that extends in a generally horizontal direction. A fixed end that is one end of the head supporter 882 is attached to the lower surface of the cup upper surface part 612 of the cup part 161. A free end that is the other end of the head supporter 882 is fixed to the ejection head 881.

A head movement mechanism 189 is provided in the upper portion of the cup part 161. The head movement mechanism 189 is fixed to the upper surface of the cup upper surface part 612 of the cup part 161 above the fixed end of the head supporter 882. The head movement mechanism 189 includes a head rotation mechanism 891 and a head elevating mechanism 892. The head rotation mechanism 891 is connected to the fixed end of the head supporter 882 through the cup upper surface part 612 and rotates the head supporter 882 along with the ejection head 881 approximately horizontally about the fixed end. The portion of the cup part 161 that the head rotation mechanism 891 passes through is sealed to prevent passage of gas and liquid. The head elevating mechanism 892 moves the head supporter 882 and the ejection head 881 up and down by moving the fixed end of the head supporter 882 in the up-down direction. The head movement mechanism 189 is moved along with the cup part 161 in the up-down direction by the cup-part movement mechanism 162.

A generally cylindrical upper nozzle 181 centered on the central axis J1 is fixed to the central portion of the chamber lid part 122. The upper nozzle 181 can be inserted into the opening at the center of the top plate 123. The upper nozzle 181 has a liquid outlet at the center of its lower end and a gas port around the liquid outlet. A generally cylindrical lower nozzle 182 centered on the central axis J1 is attached to the central portion of the lower-surface opposing part 211 of the chamber bottom part 210. The lower nozzle 182 has a liquid outlet at the center of its upper end.

Figure 3:
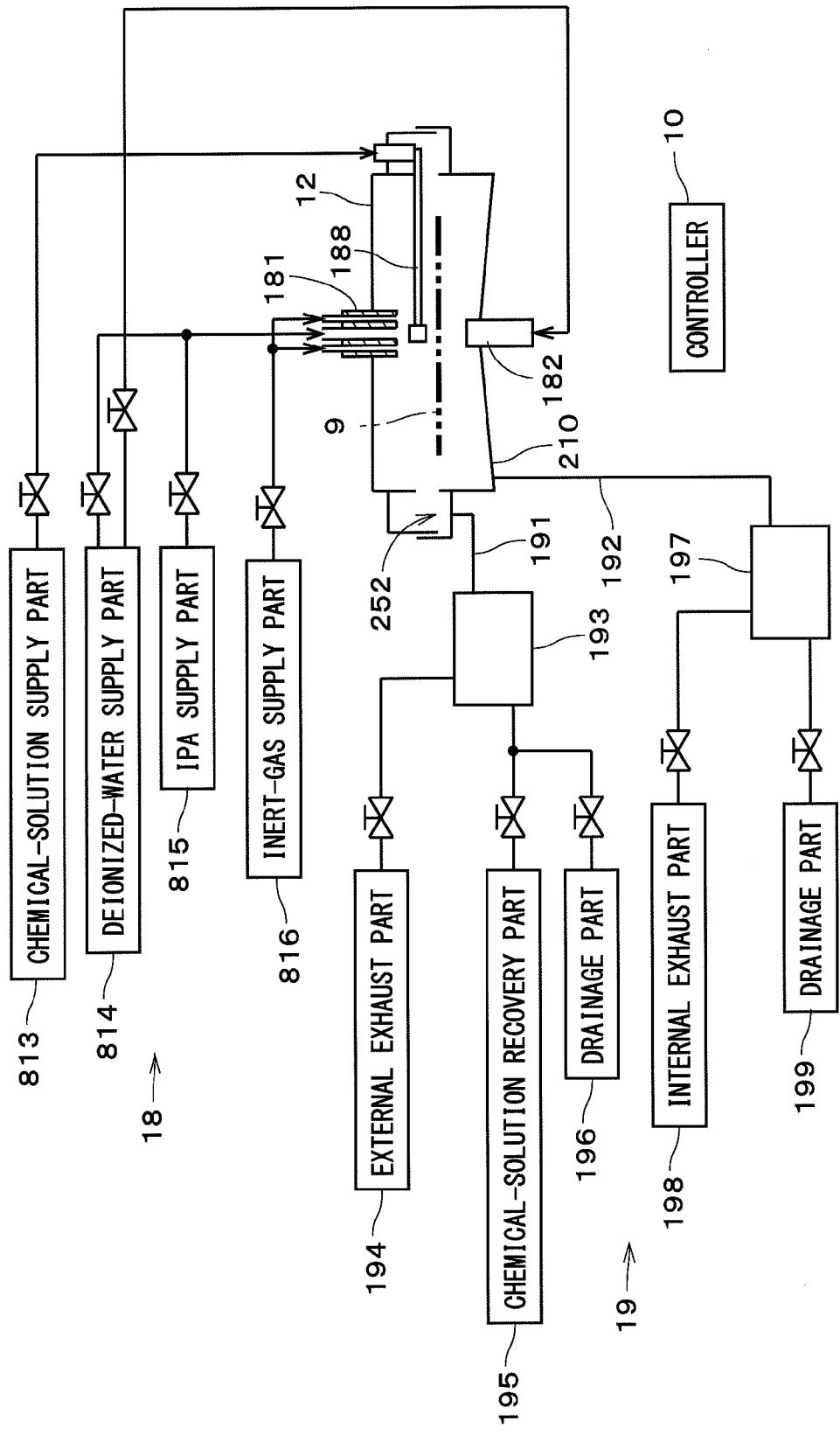
FIG. 3 is a block diagram of a gas-liquid supply part and a gas-liquid discharge part.

FIG. 3 is a block diagram of a gas-liquid supply part 18 and a gas-liquid discharge part 19 of the substrate processing apparatus 1. The gas-liquid supply part 18 includes a chemical-solution supply part 813, a deionized-water supply part 814, an IPA supply part 815, and an inert-gas supply part 816, in addition to the scan nozzle 188, the upper nozzle 181, and the lower nozzle 182, which are described above. The chemical-solution supply part 813 is connected to the scan nozzle 188 via a valve. The deionized-water supply part 814 and the IPA supply part 815 are connected to the upper nozzle 181 via different valves. The lower nozzle 182 is connected to the deionized-water supply part 814 via a valve. The upper nozzle 181 is also connected to the inert-gas supply part 816 via a valve. The upper nozzle 181 is part of a gas supply part for supplying gas to the inside of the chamber 12.

A first discharge passage 191 that is connected to the liquid receiving recessed part 252 is connected to a gas-liquid separator 193. The gas-liquid separator 193 is connected to an external exhaust part 194, a chemical-solution recovery part 195, and a drainage part 196 via different valves. A second discharge passage 192 that is connected to the chamber bottom part 210 is connected to a gas-liquid separator 197. The gas-liquid separator 197 is connected to an internal exhaust part 198 and a drainage part 199 via different valves. Constituent elements of the gas-liquid supply part 18 and the gas-liquid discharge part 19 are controlled by a controller 10. The chamber opening-and-closing mechanism 131, the substrate rotation mechanism 15, the cup-part movement mechanism 162, and the head movement mechanism 189 (see FIG. 1) are also controlled by the controller 10.

The chemical solution supplied from the chemical-solution supply part 813 to the substrate 9 through the scan nozzle 188 may, for example, be a polymer removing liquid or an etchant such as hydrofluoric acid or an aqueous solution of tetramethylammonium hydroxide. The deionized-water supply part 814 supplies deionized water (DIW) to the substrate 9 through the upper nozzle 181 and the lower nozzle 182. The IPA supply part 815 supplies isopropyl alcohol (IPA) to the substrate 9 through the upper nozzle 181.

When the aforementioned chemical solution, deionized water, and IPA are collectively referred to as processing liquids, the chemical-solution supply part 813, the deionized-water supply part 814, the IPA supply part 815, the upper nozzle 181, and the scan nozzle 188 are included in a processing liquid supply part for supplying processing liquids to the upper surface 91 of the substrate 9. In the substrate processing apparatus 1, the processing liquid supply part may include other supply parts for supplying processing liquids other than the aforementioned chemical solution, deionized water, and IPA. The deionized water supplied from the deionized-water supply part 814 to the lower nozzle 182 is supplied as a cleaning liquid for cleaning the lower surface 92 to the central portion of the lower surface 92 of the substrate 9. The deionized-water supply part 814 and the lower nozzle 182 are included in a cleaning liquid supply part for supplying a cleaning liquid.

The inert-gas supply part 816 supplies an inert gas to the interior of the chamber 12 through the upper nozzle 181. The gas supplied from the inert-gas supply part 816 may, for example, be a nitrogen ($N_2$) gas. The gas may also be a gas other than a nitrogen gas.

Figure 4:
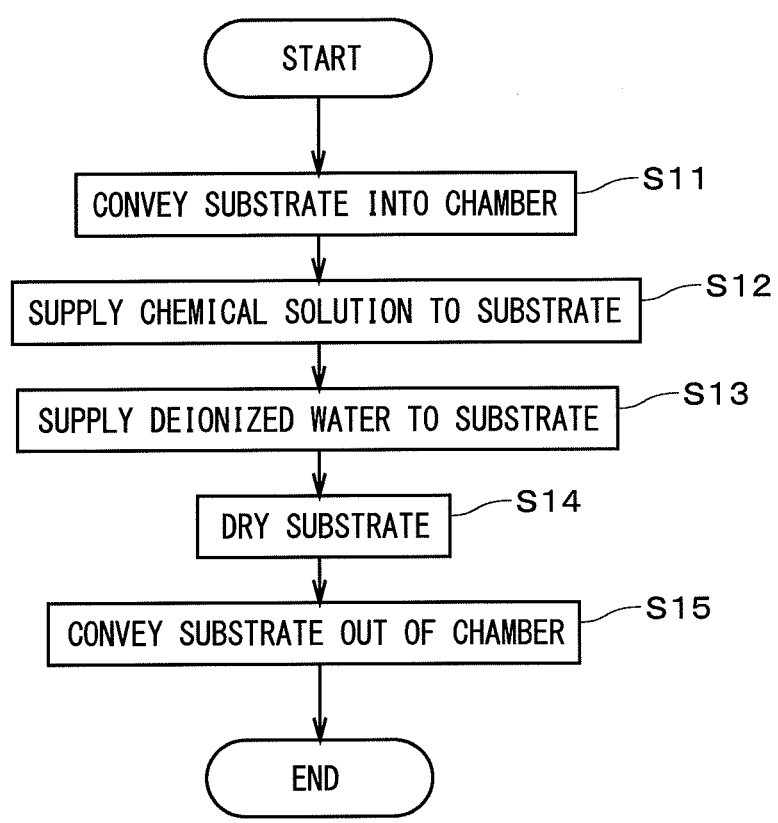
FIG. 4 is a flowchart of processing performed by the substrate processing apparatus.
Figure 5:
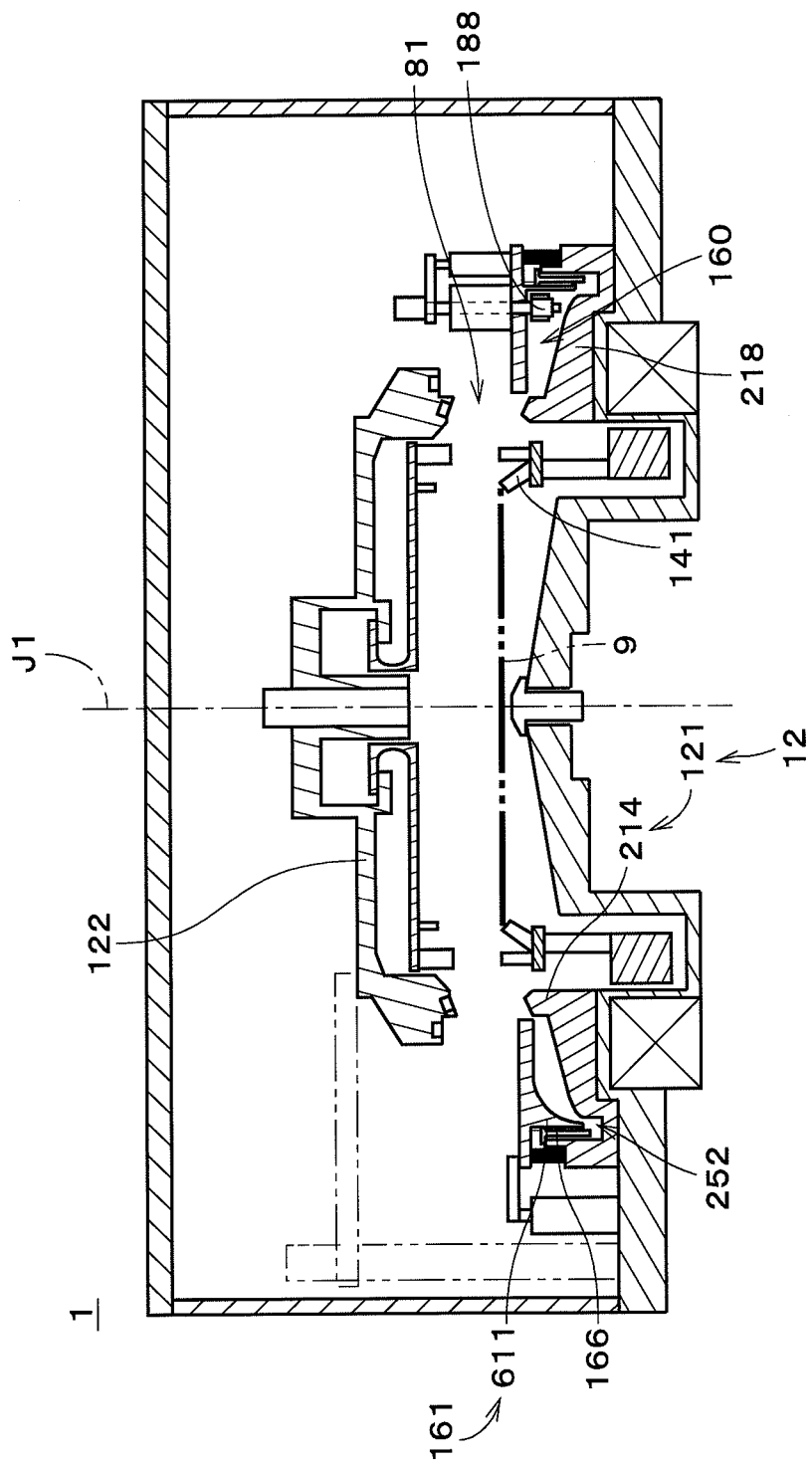
FIG. 5 is a cross-sectional view of the substrate processing apparatus.

FIG. 4 is an exemplary flow chart of processing performed on the substrate 9 by the substrate processing apparatus 1. In the substrate processing apparatus 1, in the state in which the chamber lid part 122 is spaced above the chamber body 121 and the cup part 161 is spaced below the chamber lid part 122 as illustrated in FIG. 5, the substrate 9 is conveyed into the chamber 12 by an external conveying mechanism and supported from the underside by the substrate supporter 141 (step S11). Hereinafter, the state of the chamber 12 and the cup part 161 illustrated in FIG. 5 is referred to as an "open state." The opening formed between the lid lower tubular part 228 of the chamber lid part 122 and the chamber side wall part 214 by spacing the lid lower tubular part 228 above the chamber body 121 has an annular shape centered on the central axis J1 and is hereinafter referred to as an "annular opening 81." In the substrate processing apparatus 1, the annular opening 81 is formed around (i.e., on the radially outer side of) the substrate 9 by spacing the chamber lid part 122 from the chamber body 121. In step S11, the substrate 9 is conveyed into the chamber through the annular opening 81.

When the substrate 9 is conveyed into the chamber, the scan nozzle 188 is housed in advance in a space 160 that is formed between the cup part 161 and the cup opposing part 218. The space 160 is a generally annular space that surrounds the entire outer periphery of the chamber 12. In the following description, the space 160 is referred to as a "lateral space 160." In the lateral space 160, the lower portion of the cup side wall part 611 and the lower portion of the guard part 166 are located within the liquid receiving recessed part 252 of the cup opposing part 218.

Figure 6:
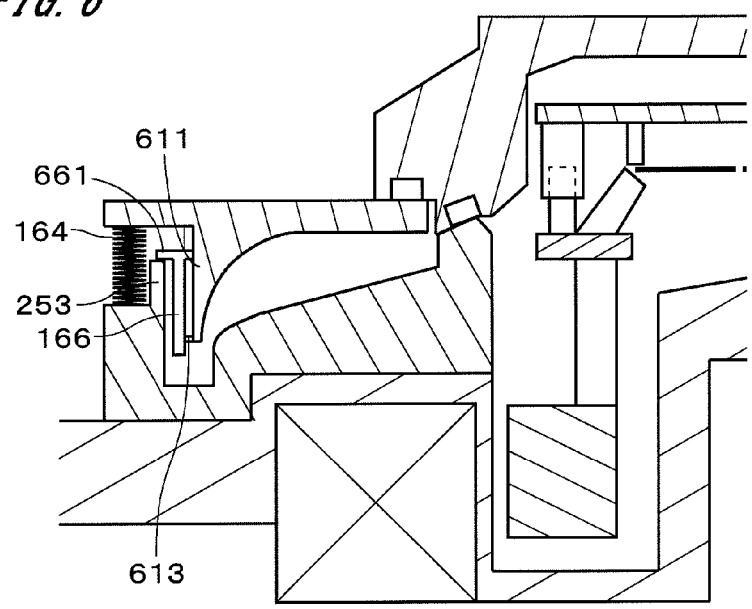
FIG. 6 is an enlarged cross-sectional view of the vicinity of the bellows.

FIG. 6 is an enlarged partial cross-sectional view of the bellows 164 in FIG. 5 and the vicinity thereof. In the state illustrated in FIG. 6, the cup side wall part 611, the guard part 166, and the liquid receiving side wall part 253 overlap one another in the radial direction. The flange part 661 at the upper end portion of the guard part 166 is in contact with the upper end of the liquid receiving side wall part 253. Thus, the guard part 166 is supported by the liquid receiving side wall part 253.

Figure 7:
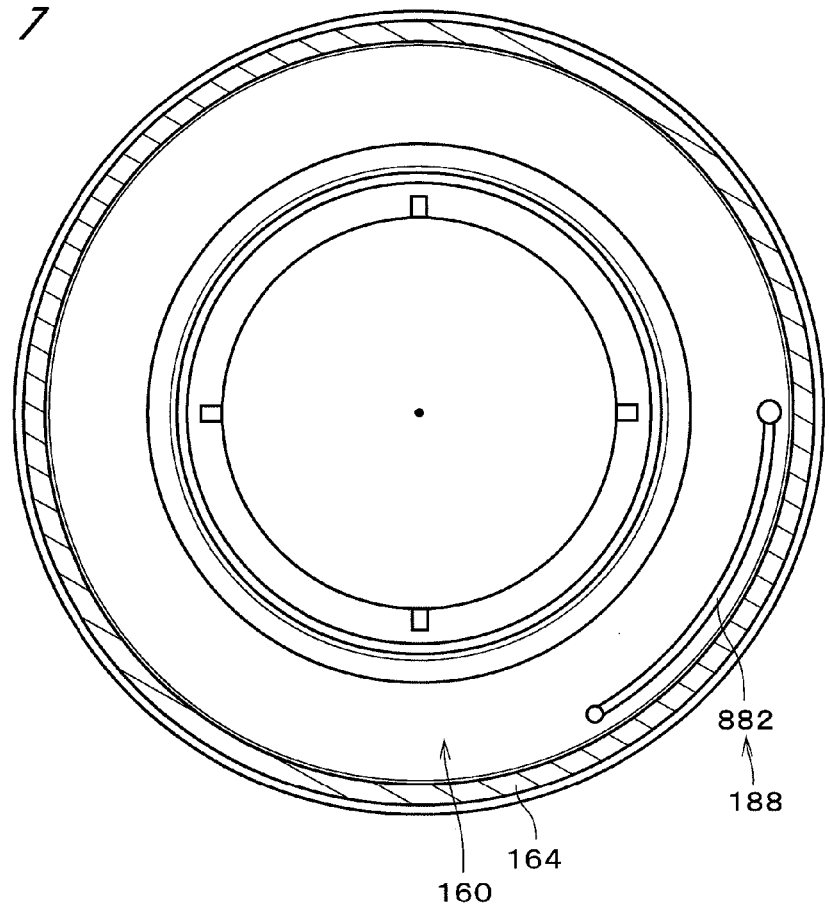
FIG. 7 is a plan view of part of the substrate processing apparatus.

FIG. 7 is a plan view of the substrate processing apparatus 1. For easy understanding of the aforementioned state in which the scan nozzle 188 is housed in the lateral space 160, constituent elements such as the chamber lid part 122 and the cup part 161 are not shown in FIG. 7. The bellows 164 is hatched. As illustrated in FIG. 7, the head supporter 882 of the scan nozzle 188 is radially curved outwardly to form a convex shape in a plan view. In other words, the scan nozzle 188 has a generally arc-like shape. In the lateral space 160, the scan nozzle 188 is disposed such that the head supporter 882 extends along the bellows 164 and the cup side wall part 611 of the cup part 161 (see FIG. 5).

When the scan nozzle 188 is housed, the scan nozzle 188 is rotated by the head rotation mechanism 891 and moved to the outside of the chamber 12 through the annular opening 81 in the state in which the cup part 161 is located at the position illustrated in FIG. 1. The scan nozzle 188 is thereby housed in the lateral space 160 between the cup part 161 and the cup opposing part 218. Then, the cup part 161 is moved down to the position illustrated in FIG. 5 by the cup-part movement mechanism 162. The lateral space 160 becomes smaller as the cup part 161 moves downward.

Figure 8:
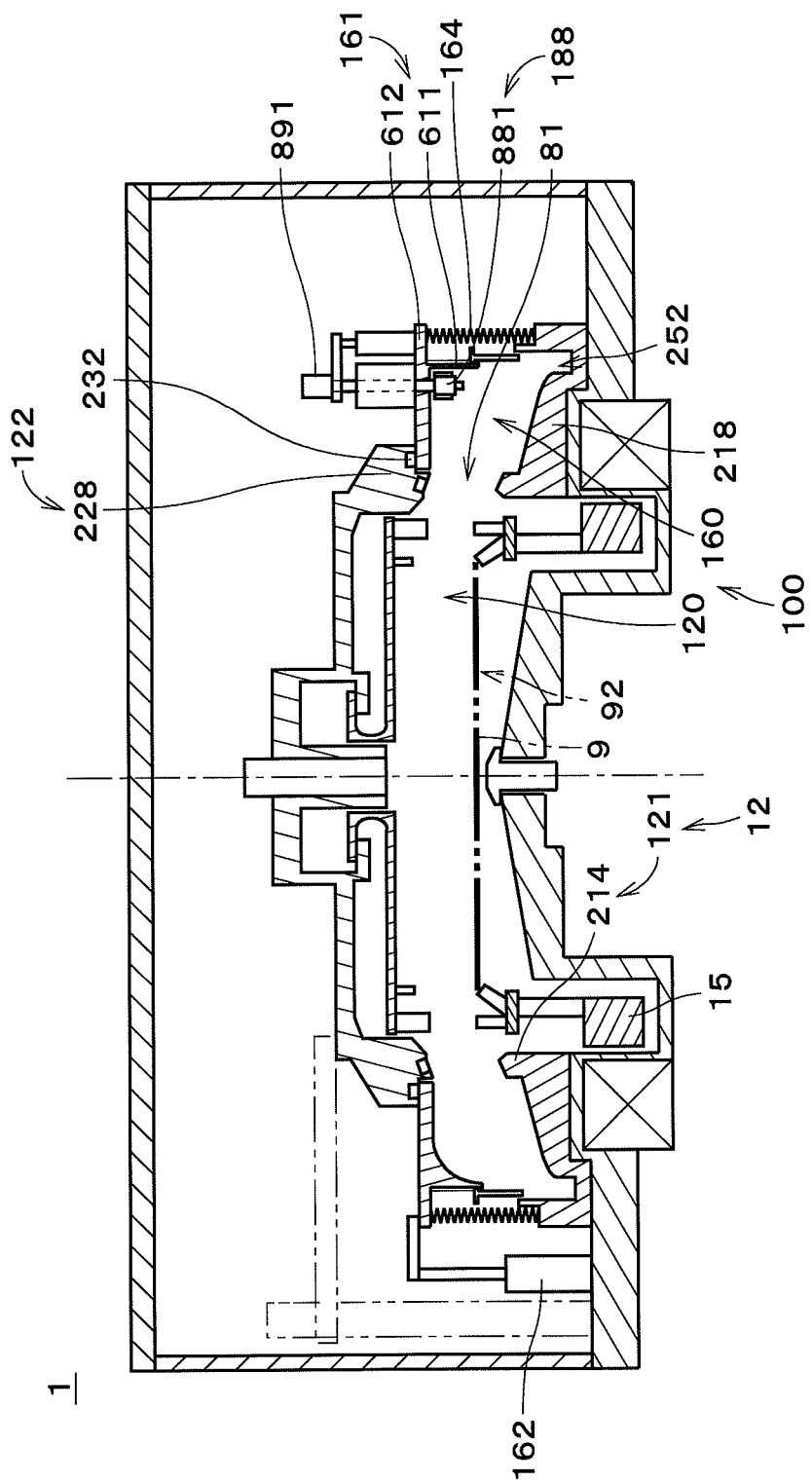
FIG. 8 is a cross-sectional view of the substrate processing apparatus.

After the substrate 9 has been conveyed into the chamber, the cup part 161 is moved upward from the position illustrated in FIG. 5 to the position illustrated in FIG. 8 and located on the radially outer side of the annular opening 81 throughout the periphery thereof. In the following description, the state of the chamber 12 and the cup part 161 illustrated in FIG. 8 is referred to as a "first sealed state" (the same applies to the state in FIG. 1). The position of the cup part 161 illustrated in FIG. 8 is referred to as a "liquid-receiving position," and the position of the cup part 161 illustrated in FIG. 5 is referred to as a "retracted position." The cup-part movement mechanism 162 moves the cup part 161 in the up-down direction between the liquid-receiving position that is on the radially outer side of the annular opening 81 and the retracted position that is below the liquid-receiving position.

When the cup part 161 is located at the liquid-receiving position, the cup side wall part 611 opposes in the radial direction the annular opening 81 formed between the lid lower tubular part 228 located on the radially inner side of the cup side wall part 611 and the chamber side wall part 214. When the cup part 161 is located at the liquid-receiving position, the upper surface of the inner edge portion of the cup upper surface part 612 is in contact with the whole periphery of the lip seal 232 located at the lower end of the outer edge portion of the chamber lid part 122 (i.e., the lower end of the lid lower tubular part 228). A seal part for preventing passage of gas and liquid is formed between the chamber lid part 122 and the cup upper surface part 612 of the cup part 161. This forms a sealed space (hereinafter, referred to as an "enlarged sealed space 100") that is surrounded by the chamber lid part 122, the cup part 161, the bellows 164, and the chamber body 121. The enlarged sealed space 100 is one space formed by linkage of the chamber space 120 between the chamber lid part 122 and the chamber body 121 and the lateral space 160 surrounded by the cup part 161 and the bellows 164 through the annular opening 81.

When the cup part 161 moves upward from the retracted position illustrated in FIG. 5 to the liquid-receiving position illustrated in FIG. 8, the guard part 166 supported by the liquid receiving side wall part 253 remains stationary until the cup side wall part 611 moves upward from the position illustrated in FIG. 6 to a predetermined position. When the cup side wall part 611 has moved to the predetermined position, the flange part 661 at the upper end of the guard part 166 comes in contact with the flange part 613 at the lower end of the cup side wall part 611. Then, when the cup side wall part 611 is further moved upward, the guard part 166 moves upward along with the cup side wall part 611 to the position illustrated in FIG. 2 while being suspended from the cup side wall part 611. As a result, the guard part 166 covers the gap between the lower end of the cup side wall part 611 and the upper end of the liquid receiving side wall part 253. Note that the guard part 166 does not necessarily have to be suspended from the cup side wall part 611 during the movement as long as the guard part 166 moves upward along with the upward movement of the cup part 161.

Next, the substrate rotation mechanism 15 illustrated in FIG. 8 starts rotating the substrate 9 at a constant rotational speed (a relatively low rotational speed, which is hereinafter referred to as a "stationary rotational speed"). Moreover, the inert-gas supply part 816 (see FIG. 3) starts supplying an inert gas (here, a nitrogen gas) to the enlarged sealed space 100, and the external exhaust part 194 (see FIG. 3) starts exhausting the gas in the enlarged sealed space 100. Thus, after a predetermined period of time has elapsed, the enlarged sealed space 100 is in an inert-gas-filled state in which the enlarged sealed space 100 is filled with the inert gas (i.e., a low oxygen atmosphere in which the low oxygen concentration is low). Note that the supply of the inert gas to the enlarged sealed space 100 and the discharge of the gas in the enlarged sealed space 100 may be started in the open state illustrated in FIG. 5.

Then, under the control of the controller 10, a predetermined amount of chemical solution is supplied from the chemical-solution supply part 813 to the scan nozzle 188 attached to the cup part 161 in the lateral space 160 (see FIG. 3). The chemical solution is thus pre-dispensed from the ejection head 881 in the state in which the scan nozzle 188 is housed in the lateral space 160 (i.e., the state in which the scan nozzle 188 as a whole is located within the lateral space 160). The chemical solution that is pre-dispensed from the ejection head 881 is received by the liquid receiving recessed part 252.

After the pre-dispense has ended, the head supporter 882 is rotated by the head rotation mechanism 891 disposed outside the enlarged sealed space 100, and the ejection head 881 of the scan nozzle 188 moves to above the substrate 9 through the annular opening 81 as illustrated in FIG. 1. Moreover, the head rotation mechanism 891 is controlled by the controller 10 to start reciprocating movement of the ejection head 881 above the substrate 9. The ejection head 881 continuously moves reciprocally in the horizontal direction along a predetermined travel path that connects the central portion and outer edge portion of the substrate 9.

Then, the chemical solution is supplied from the chemical-solution supply part 813 to the ejection head 881, and the chemical solution is supplied from the ejection head 881 that is oscillating in the horizontal direction to the upper surface 91 of the substrate 9 (step S12). The chemical solution from the ejection head 881 is continuously supplied to the upper surface 91 of the rotating substrate 9. The chemical solution is spread to the outer periphery of the substrate 9 by the rotation of the substrate 9, and the entire upper surface 91 is covered with the chemical solution. Supplying the chemical solution from the horizontally oscillating ejection head 881 to the rotating substrate 9 allows the chemical solution to be approximately uniformly supplied to the upper surface 91 of the substrate 9. This also improves uniformity in the temperature of the chemical solution on the substrate 9. As a result, uniformity in the chemical-solution processing performed on the substrate 9 can be improved.

In the enlarged sealed space 100, the chemical solution dispersed from the upper surface 91 of the rotating substrate 9 is received by the cup side wall part 611 of the cup part 161 through the annular opening 81 and guided to the liquid receiving recessed part 252. The chemical solution guided to the liquid receiving recessed part 252 flows through the first discharge passage 191 illustrated in FIG. 3 into the gas-liquid separator 193. In the chemical-solution recovery part 195, the chemical solution is recovered from the gas-liquid separator 193 and reused after impurities or the like are removed from the chemical solution by a filter or the like.

After a predetermined period of time (e.g., 60 to 120 seconds) has elapsed since the supply of the chemical solution was started, the supply of the chemical solution from the scan nozzle 188 is stopped. Then, the substrate rotation mechanism 15 increases the rotational speed of the substrate 9 from the stationary rotational speed for only a predetermined period of time (e.g., one to third seconds) to remove the chemical solution from the substrate 9. Moreover, the scan nozzle 188 is rotated by the head rotation mechanism 891 and moved from the chamber space 120 to the lateral space 160 through the annular opening 81 as illustrated in FIG. 8.

When the scan nozzle 188 has moved into the lateral space 160, the chamber lid part 122 and the cup part 161 move downward in synchronization with that movement. Then, as illustrated in FIG. 9, the lip seal 231 located at the lower end of the outer edge portion of the chamber lid part 122 (i.e., the lower end of the lid lower tubular part 228) comes in contact with the upper portion of the chamber side wall part 214, so that the annular opening 81 is closed and the chamber space 120 is enclosed while being isolated from the lateral space 160. The cup part 161 is located at the retracted position as in FIG. 5. Thus, the cup side wall part 611, the guard part 166, and the liquid receiving side wall part 253 overlap one another in the radial direction as in FIG. 6. The guard part 166 is supported by the liquid receiving side wall part 253.

In the following description, the state of the chamber 12 and the cup part 161 illustrated in FIG. 9 is referred to as a "second sealed state." In the second sealed state, the substrate 9 directly opposes the inner wall of the chamber 12, and there is no other liquid receiving parts therebetween. The scan nozzle 188 is isolated from the chamber space 120 and housed in the lateral space 160.

In the second sealed state, the second contact parts 421 of the substrate pressing part 142 are in contact with the outer edge portion of the substrate 9. The lower surface of the top plate 123 and the supporter base 413 of the substrate supporter 141 have a plurality of pairs of magnets (not shown), the magnets of each pair facing each other in the up-down direction. Each pair of magnets is hereinafter also referred to as a "magnet pair." In the substrate processing apparatus 1, a plurality of magnet pairs are equiangularly arranged at different circumferential positions from the first contact parts 411, the second contact parts 421, the first engagement parts 241, and the second engagement parts 242. In the state in which the substrate pressing part 142 is in contact with the substrate 9, a downward force is exerted on the top plate 123 by the magnetic force (attractive force) acting between the magnet pairs. Thus, the substrate pressing part 142 presses the substrate 9 against the substrate supporter 141.

In the substrate processing apparatus 1, the substrate pressing part 142 presses the substrate 9 against the substrate supporter 141 with the weight of the top plate 123 and the magnetic force of the magnet pairs. Thus, the substrate 9 can be firmly held by sandwiching the substrate 9 from above and below between the substrate pressing part 142 and the substrate supporter 141.

In the second sealed state, the flange part 239 of the held part 237 is spaced above the flange part 224 of the plate holder 222, and the plate holder 222 and the held part 237 are not in contact with each other. In other words, the plate holder 222 releases hold of the top plate 123. Thus, the top plate 123 is rotated independently of the chamber lid part 122, along with the substrate holder 14 and the substrate 9 held by the substrate holder 14, by the substrate rotation mechanism 15.

In the second sealed state, the second engagement parts 242 fit in the recessed portions formed in the lower portions of the first engagement parts 241. Thus, the top plate 123 is engaged with the supporter base 413 of the substrate supporter 141 in the circumferential direction about the central axis J1. In other words, the first engagement parts 241 and the second engagement parts 242 serve as a position regulation member that regulates the position of the top plate 123 relative to the substrate holder 14 in the rotational direction (i.e., fixes the top plate 123 to the substrate holder 14 in the circumferential direction). When the chamber lid part 122 moves downward, the rotational position of the supporter base 413 is controlled by the substrate rotation mechanism 15 such that the first engagement parts 241 and the second engagement parts 242 fit together.

When the chamber space 120 and the lateral space 160 are sealed independently, the external exhaust part 194 (see FIG. 3) stops exhausting gas, and the internal exhaust part 198 starts exhausting the gas in the chamber space 120. Then, the deionized-water supply part 814 starts supplying deionized water to the substrate 9 (step S13).

The deionized water from the deionized-water supply part 814 is ejected from the upper nozzle 181 and the lower nozzle 182 and continuously supplied to the central portions of the upper surface 91 and the lower surface 92 of the substrate 9. The deionized water is spread to the outer peripheries of the upper surface 91 and the lower surface 92 of the substrate 9 by the rotation of the substrate 9 and dispersed radially outward from the outer peripheral edge of the substrate 9. The deionized water dispersed from the substrate 9 is received by the inner wall of the chamber 12 (i.e., the inner walls of the lid lower tubular part 228 and the chamber side wall part 214) and discarded through the second discharge passage 192, the gas-liquid separator 197, and the drainage part 199 illustrated in FIG. 3 (the same applies to processing for drying the substrate 9, which will be described later). Thus, cleaning of the inside of the chamber 12 is substantially performed together with the processing for rinsing the upper surface 91 of the substrate 9 and the processing for cleaning the lower surface 92.

After a predetermined period of time has elapsed since the supply of the deionized water was started, the supply of the deionized water from the deionized-water supply part 814 (see FIG. 3) is stopped. Then, in the chamber space 120, the rotational speed of the substrate 9 is sufficiently increased from the stationary rotational speed. Accordingly, the deionized water is removed from above the substrate 9, and processing for drying the substrate 9 is performed (step S14). After a predetermined period of time has elapsed since the drying of the substrate 9 was started, the rotation of the substrate 9 is stopped. The processing for drying the substrate 9 may be performed under a reduced-pressure atmosphere in which the pressure in the chamber space 120 is reduced to below atmospheric pressure by the inner exhaust part 198.

Thereafter, the chamber lid part 122 and the top plate 123 are moved upward and the chamber 12 is in the open state as illustrated in FIG. 5. In step S14, liquid does not remain almost on the lower surface of the top plate 123 because the top plate 123 rotates along with the substrate support part 141, and therefore, the liquid does not drop from the top plate 123 onto the substrate 9 during the upward movement of the chamber lid part 122. The substrate 9 is conveyed out of the chamber 12 by the external conveying mechanism (step S15). Note that, after the supply of the deionized water from the deionized-water supply part 184 and before the drying of the substrate 9, IPA may be supplied from the IPA supply part 185 onto the substrate 9 to replace the deionized water.

In the substrate processing apparatus 1, the chamber lid part 122 and the cup part 161 serve as a "space forming lid part" that is a lid part of the enlarged sealed space 100. The chamber body 121 serves as a "space forming main body" whose top is covered with the space forming lid part. The liquid receiving side wall part 253 serves as a "main body side wall part" that is located on the outer periphery of the space forming main body. The cup side wall part 611 serves as a "lid side wall part" that is located on the outer periphery of the space forming lid part, and is located on the radially inner side of the main body side wall part. The lid lower tubular part 228 serves as an "inner lid side wall part" that is located on the radially inner side of the lid side wall part in the space forming lid part.

When the position of the space forming lid part (i.e., the chamber lid part 122 and the cup part 161) illustrated in FIG. 9 is referred to as a "first position" and the position of the space forming lid part illustrated in FIG. 1 is referred to as a "second position," the chamber opening-and-closing mechanism 131 and the cup-part movement mechanism 162 serve as a space-forming-part movement mechanism for moving the space forming lid part relative to the space forming main body in the up-down direction between the first position and the second position that is above the first position.

As described above, in the state of the substrate processing apparatus 1 in which the space forming lid part is located at the first position, the cup side wall part 611 serving as the lid side wall part and the liquid receiving side wall part 253 serving as the main body side wall part overlap each other in the radial direction, and the guard part 166 is supported by the main body side wall part. When the space forming lid part is moved from the first position to the second position, the guard part 166 moves upward while being suspended from the lid side wall part. In the state in which the space forming lid part is located at the second position, the lower end of the lid side wall part is located above the upper end of the main body side wall part, and the guard part 166 covers the gap between the lower end of the lid side wall part and the upper end of the main body side wall part.

This configuration can suppress adhesion of the processing liquid to the outer side wall part 164 even if the processing liquid from the rotating substrate 9 is dispersed below the cup side wall part 611. Consequently, the generation of particles due to adhesion of the processing liquid to the outer side wall part 164 and drying can be suppressed. It is also possible to suppress leakage of the processing liquid from the connection between the outer side wall part 164 and the bellows fixing part 254 to the outside of the enlarged sealed space 100.

Moreover, as described above, the movement of the guard part 166 in the up-down direction occurs in conjunction with the movement of the cup part 161 in the up-down direction by the cup-part movement mechanism 162. This eliminates the need to provide a mechanism for moving the guard part 166 in the up-down direction, thus reducing the size of the substrate processing apparatus 1.

In the state of the substrate processing apparatus 1 in which the space forming lid part is located at the second position, the lower end portion of the guard part 166 overlaps the upper end portion of the main body side wall part in the radial direction. Thus, a so-called labyrinth structure is formed between the space on the radially inner side of the guard part 166 and the space between the liquid receiving side wall part 253 serving as the main body side wall part and the outer side wall part 164. As a result, adhesion of the processing liquid to the outer side wall part 164 can be further suppressed.

As described above, in the state in which the space forming lid part is located at the first position, the lid lower tubular part 228 serving as the inner lid side wall part is in contact with the chamber side wall part 214 of the chamber body 121 serving as the space forming main body, forming the chamber space 120 that is an internal sealed space. In the state in which the space forming lid part is located at the second position, the inner lid side wall part is separated from the space forming main body, forming the annular opening 81 between the inner lid side wall part and the space forming main body, and the lid side wall part receives the processing liquid dispersed from the substrate 9 through the annular opening 81.

In this way, the substrate processing apparatus 1 can selectively use two types of processing spaces (i.e., the chamber space 120 and the enlarged sealed space 100) depending on the content of processing that is performed on the substrate 9. Even in the case where the outer side wall part 164 is included in a member that forms a processing space (i.e., processing is performed in the enlarged sealed space 100), adhesion of the processing liquid to the outer side wall part 164 can be suppressed. Accordingly, the structure of the substrate processing apparatus 1 is particularly suitable for a substrate processing apparatus provided with the scan nozzle 188 that moves to above the substrate 9 through the annular opening 81 and supplies a processing liquid to the substrate 9.

As described above, the substrate processing apparatus 1 can suppress adhesion of processing liquids to the outer side wall part 164. The structure of the substrate processing apparatus 1 is thus particularly suitable for a substrate processing apparatus that includes, as the outer side wall part 164, a bellows for which it is relatively difficult to remove adhering processing liquids.

Figure 10:
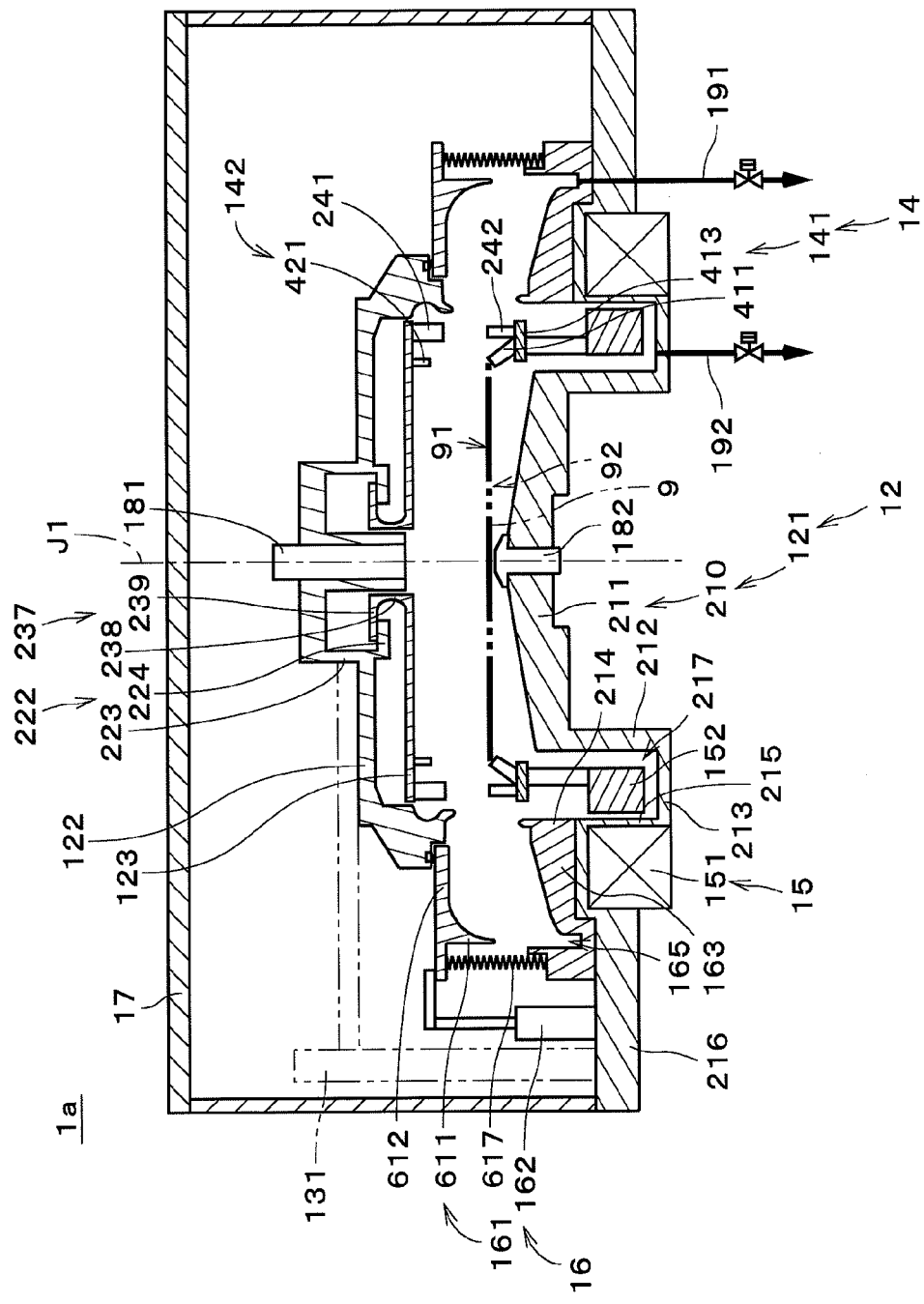
FIG. 10 is a cross-sectional view of a substrate processing apparatus according to a second embodiment.

FIG. 10 is a cross-sectional view of a substrate processing apparatus 1*a* according to a second embodiment of the present invention. The substrate processing apparatus 1*a* is a single wafer processing apparatus for processing generally disc-shaped semiconductor substrates 9 (hereinafter, simply referred to as "substrates 9") one at a time by supplying processing liquids to the substrates 9. FIG. 10 omits illustration of cross-hatching of cross sections for some constituent elements of the substrate processing apparatus 1*a* (the same applies to the other cross-sectional views).

The substrate processing apparatus 1*a* includes a chamber 12, a top plate 123, a chamber opening-and-closing mechanism 131, a substrate holder 14, a substrate rotation mechanism 15, a liquid receiving part 16, and a cover 17. The cover 17 covers the top and sides of the chamber 12.

The chamber 12 includes a chamber body 121 and a chamber lid part 122. The inner peripheral surface of the chamber 12 is a generally cylindrical surface centered on the central axis J1 pointing in the up-down direction. The chamber body 121 includes a chamber bottom part 210 and a chamber side wall part 214. The chamber bottom part 210 includes a generally disc-shaped central part 211, a generally cylindrical inner side wall part 212 that extends downward from the outer edge portion of the central part 211, an annular bottom part 213 that has a generally annular plate-like shape and extends radially outward from the lower end of the inner side wall part 212, a generally cylindrical outer side wall part 215 that extends upward from the outer edge portion of the annular bottom part 213, and a generally annular plate-like base part 216 that extends radially outward from the upper end portion of the outer side wall part 215.

The chamber side wall part 214 has an annular shape centered on the central axis J1. The chamber side wall part 214 is disposed on the base part 216 and forms part of the inner peripheral surface of the chamber body 121. A member that forms the chamber side wall part 214 also serves as part of the liquid receiving part 16 as will be described later. In the following description, the space surrounded by the chamber side wall part 214, the outer side wall part 215, the annular bottom part 213, the inner side wall part 212, and the outer edge portion of the central part 211 is referred to as a "lower annular space 217."

When the substrate 9 is supported by the substrate holder 14, the lower surface 92 of the substrate 9 opposes the upper surface of the central part 211 of the chamber bottom part 210. In the following description, the central part 211 of the chamber bottom part 210 is referred to as a "lower-surface opposing part 211."

The chamber lid part 122 has a generally disc-like shape perpendicular to the central axis J1 and includes the upper portion of the chamber 12. The chamber lid part 122 closes the upper opening of the chamber body 121. FIG. 10 illustrates a state in which the chamber lid part 122 is spaced from the chamber body 121. When the chamber lid part 122 closes the upper opening of the chamber body 121, the outer edge portion of the chamber lid part 122 comes in close proximity to the upper portion of the chamber side wall part 214.

The chamber opening-and-closing mechanism 131 moves the chamber lid part 122 relative to the chamber body 121 in the up-down direction, the chamber lid part 122 being a movable part of the chamber 12, and the chamber body 121 being the other part of the chamber 12 other than the chamber lid part 122. In the present embodiment, the position of the chamber body 121 is fixed, and the chamber opening-and-closing mechanism 131 is a lid elevating mechanism for moving the chamber lid part 122 up and down. When the chamber lid part 122 is moved in the up-down direction, the top plate 123 is also moved along with the chamber lid part 122 in the up-down direction. When the chamber lid part 122 comes in close proximity to the chamber body 121 to close the upper opening, a chamber space 120 (see FIG. 13) is formed in the chamber 12. In other words, the chamber space 120 is substantially closed by bringing the chamber lid part 122 into close proximity to the chamber body 121.

Note that the upper opening may be closed by bringing the chamber lid part 122 into contact with the chamber body 121 as will be described later. In this case, the chamber space 120 is in a sealed state when the upper opening of the chamber body 121 is closed by the chamber lid part 122. Hereinafter, the state in which the chamber space 120 is formed by bringing the chamber lid part 122 into close proximity to or into contact with the upper opening is referred to as a "chamber closed state."

The substrate holder 14 holds the substrate 9 in a horizontal position. That is, the substrate 9 is held by the substrate holder 14 with its upper surface 91 facing up perpendicularly to the central axis 31. In the chamber closed state, the substrate 9 is located within the chamber space 120. The substrate holder 14 includes the aforementioned substrate supporter 141 that supports the outer edge portion of the substrate 9 (i.e., the area including and in the vicinity of the outer peripheral edge) from the underside, and a substrate pressing part 142 that presses the outer edge portion of the substrate 9 supported by the substrate supporter 141 from above. The substrate supporter 141 includes a generally annular plate-like supporter base 413 centered on the central axis 31, and a plurality of first contact parts 411 that are fixed to the upper surface of the supporter base 413. The substrate pressing part 142 includes a plurality of second contact parts 421 that are fixed to the lower surface of the top plate 123. In actuality, the circumferential positions of the second contact parts 421 differ from the circumferential positions of the first contact parts 411.

The top plate 123 has a generally disc-like shape perpendicular to the central axis 31. The top plate 123 is disposed below the chamber lid part 122 and above the substrate supporter 141. The top plate 123 has an opening at the center. When the substrate 9 is supported by the substrate supporter 141, the upper surface 91 of the substrate 9 opposes the lower surface of the top plate 123 that is perpendicular to the central axis 31. The top plate 123 has a larger diameter than the substrate 9, and the outer peripheral edge of the top plate 123 is located on the radially outer side of the entire outer peripheral edge of the substrate 9.

In the state illustrated in FIG. 10, the top plate 123 is suspended from and supported by the chamber lid part 122. The chamber lid part 122 includes a generally annular plate holder 222 in the central portion. The plate holder 222 includes a generally cylindrical tubular part 223 centered on the central axis 31 and a generally disc-shaped flange part 224 centered on the central axis J1. The flange part 224 extends radially inward from the lower end of the tubular part 223.

The top plate 123 includes an annular held part 237. The held part 237 includes a generally cylindrical tubular part 238 centered on the central axis J1 and a generally disc-shaped flange part 239 centered on the central axis J1. The tubular part 238 extends upward from the upper surface of the top plate 123. The flange part 239 extends radially outward from the upper end of the tubular part 238. The tubular part 238 is located on the radially inner side of the tubular part 223 of the plate holder 222. The flange part 239 is located above the flange part 224 of the plate holder 222 and opposes the flange part 224 in the up-down direction. When the lower surface of the flange part 239 of the held part 237 comes in contact with the upper surface of the flange part 224 of the plate holder 222, the top plate 123 is attached to the chamber lid part 122 so as to be suspended from the chamber lid part 122.

The substrate rotation mechanism 15 is a so-called hollow motor. The substrate rotation mechanism 15 includes an annular stator 151 centered on the central axis J1 and an annular rotor 152. The rotor 152 includes a generally annular permanent magnet. The surface of the permanent magnet is molded of a PTFE resin. The rotor 152 is disposed within the lower annular space 217. The supporter base 413 of the substrate supporter 141 is attached to the upper portion of the rotor 152 via a connection member. The supporter base 413 is located above the rotor 152.

The stator 151 is disposed on the radially outer side of the rotor 152 outside the chamber 12. In the present embodiment, the stator 151 is fixed to the outer side wall part 215 and the base part 216 of the chamber bottom part 210 and located below the liquid receiving part 16. The stator 151 includes a plurality of coils arranged in the circumferential direction about the central axis J1.

Supplying current to the stator 151 produces a torque about the central axis J1 between the stator 151 and the rotor 152. This causes the rotor 152 to rotate in a horizontal position about the central axis J1. The magnetic force acting between the stator 151 and the rotor 152 allows the rotor 152 to float in the chamber 12 without being in direct or indirect contact with the chamber 12 and rotate the substrate 9 along with the substrate supporter 141 about the central axis J1 in a floating state.

The liquid receiving part 16 includes a cup part 161, a cup-part movement mechanism 162, and a cup opposing part 163. The cup part 161 has an annular shape centered on the central axis J1 and is located on the radially outer side of the chamber 12 throughout the periphery thereof. The cup-part movement mechanism 162 moves the cup part 161 in the up-down direction. The cup-part movement mechanism 162 is disposed on the radially outer side of the cup part 161. The cup-part movement mechanism 162 is located at a different circumferential position from the aforementioned chamber opening-and-closing mechanism 131. The cup opposing part 163 is located below the cup part 161 and opposes the cup part 161 in the up-down direction. The cup opposing part 163 is part of a member that forms the chamber side wall part 214. The cup opposing part 163 includes an annular liquid receiving recessed part 165 that is located on the radially outer side of the chamber side wall part 214.

The cup part 161 includes a side wall part 611, an upper surface part 612, and a bellows 617. The side wall part 611 has a generally cylindrical shape centered on the central axis J1. The upper surface part 612 has a generally annular plate-like shape centered on the central axis J1 and extends radially inward and outward from the upper end portion of the side wall part 611. When the cup part 161 moves downward, the lower portion of the side wall part 611 is located within the liquid receiving recessed part 165.

The bellows 617 has a generally cylindrical shape centered on the central axis J1 and is extendable in the up-down direction. The bellows 617 is provided on the radially outer side of the side wall part 611 throughout the periphery thereof. The bellows 617 is made of a material that prevents passage of gas and liquid. The upper end portion of the bellows 617 is connected to the lower surface of the outer edge portion of the upper surface part 612 throughout the periphery thereof. In other words, the upper end portion of the bellows 617 is indirectly connected to the side wall part 611 via the upper surface part 612. The connection between the bellows 617 and the upper surface part 612 is sealed to prevent passage of gas and liquid. The lower end portion of the bellows 617 is indirectly connected to the chamber body 121 via the cup opposing part 163. The connection between the lower end portion of the bellows 617 and the cup opposing part 163 also prevents passage of gas and liquid.

An upper nozzle 181 is fixed to the center of the chamber lid part 122. The upper nozzle 181 can be inserted into the opening at the center of the top plate 123. The upper nozzle 181 has a plurality of liquid outlets at the center and a gas port around the liquid outlets. The liquid outlets eject different types of processing liquids. The upper nozzle 181 also serves as a processing liquid ejection part for supplying a processing liquid to the substrate 9 and also serves as a gas ejection part for supplying gas to the substrate 9. Note that the chamber 12 may include a scan nozzle scanned by an ejection head for ejecting a processing liquid to the substrate 9. A lower nozzle 182 is attached to the center of the lower-surface opposing part 211 of the chamber bottom part 210. The installation positions of the upper nozzle 181 and the lower nozzle 182 are not limited to the central portions and may, for example, be positions that oppose the outer edge portion of the substrate 9.

A first discharge passage 191 is connected to the liquid receiving recessed part 165 of the liquid receiving part 16. The first discharge passage 191 is connected to a gas-liquid separator. A second discharge passage 192 is connected to the lower annular space 217 of the chamber bottom part 210. The second discharge passage 192 is connected to another gas-liquid separator. The operations of the chamber opening-and-closing mechanism 131, the substrate rotation mechanism 15, and the cup-part movement mechanism 162 and the flows of liquid and gas through the nozzles and the discharge passages are controlled by a controller not shown.

The upper nozzle 181 is connected to a chemical-solution supply part via a valve. The chemical solution supplied through the upper nozzle 181 to the substrate 9 may, for example, be an etchant such as hydrofluoric acid or an aqueous solution of tetramethylammonium hydroxide (TMAH). The upper nozzle 181 is also connected to an IPA supply part and a deionized-water supply part via valves. The upper nozzle 181 supplies deionized water (DIW) and isopropyl alcohol (IPA) to the substrate 9. The lower nozzle 182 is connected to the deionized-water supply part via a valve. Through the lower nozzle 182, deionized water is supplied to the lower surface of the substrate 9. The substrate processing apparatus 1a may also include other processing liquid supply parts for supplying processing liquids other than the aforementioned processing liquids including the chemical solution, deionized water, and IPA.

The upper nozzle 181 is also connected to an inert-gas supply part via a valve. Through the upper nozzle 181, an inert gas is supplied into the chamber 12. In the present embodiment, a nitrogen ($N_2$) gas is used as the inert gas, but the inert gas may be a gas other than the nitrogen gas.

As illustrated in FIG. 10, the lower surface of the outer edge portion of the top plate 123 has a plurality of first engagement parts 241 arranged in the circumferential direction, and the upper surface of the supporter base 413 has a plurality of second engagement parts 242 arranged in the circumferential direction. In actuality, the first engagement parts 241 and the second engagement parts 242 are disposed at different circumferential positions from the first contact parts 411 of the substrate supporter 141 and the second contact parts 421 of the substrate pressing part 142. Preferably, there are three or more sets of these engagement parts, and four sets of engagement parts are provided in the present embodiment. Each first engagement part 241 has an upwardly recessed portion at the bottom. The second engagement parts 242 protrude upward from the supporter base 413.

Figure 11:
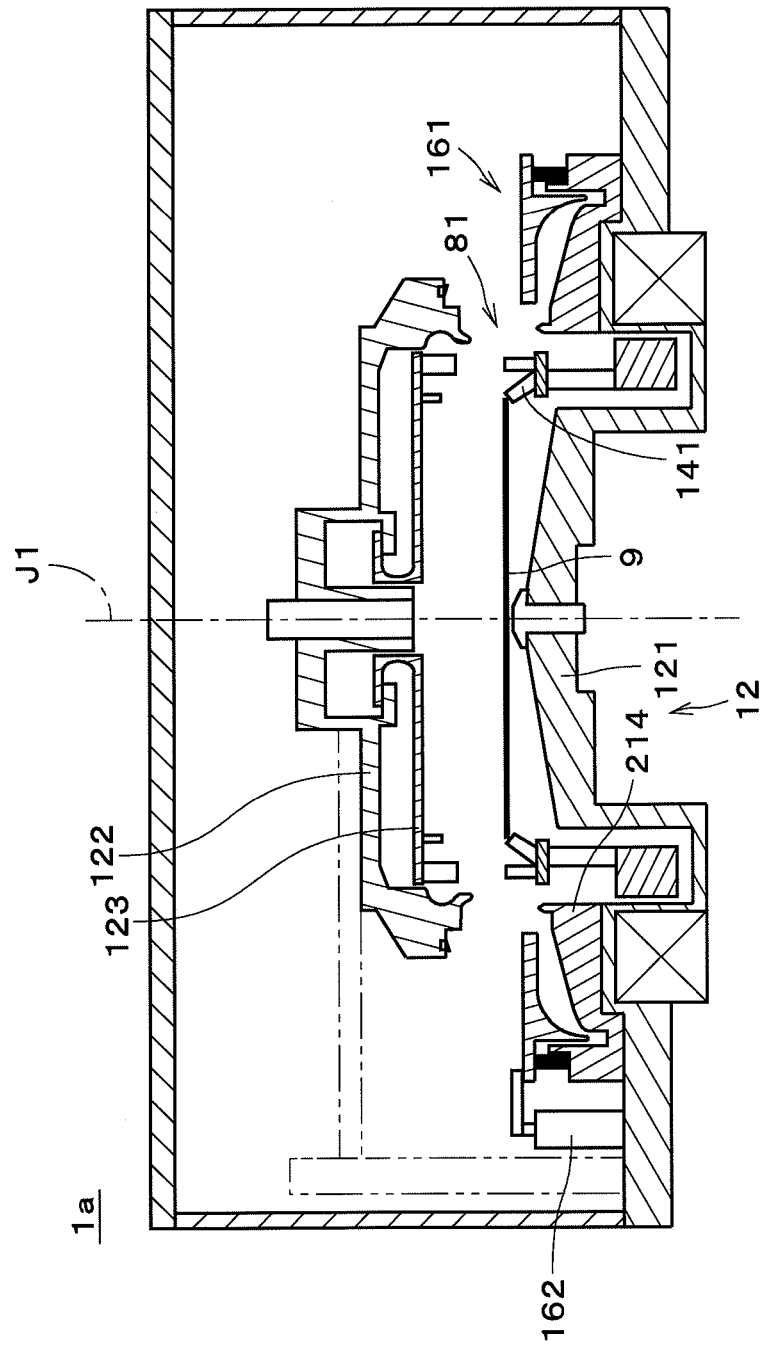
FIG. 11 is a cross-sectional view of the substrate processing apparatus in an open state.

The flowchart of processing performed on the substrate 9 by the substrate processing apparatus 1a is similar to the flowchart of FIG. 2. In the substrate processing apparatus 1a, the substrate 9 is conveyed into the chamber 12 by an external conveying mechanism and supported from the underside by the substrate supporter 141 in a state in which the chamber lid part 122 is spaced above the chamber body 121 and the cup part 161 is spaced below the chamber lid part 122 as illustrated in FIG. 11 (step S11). Hereinafter, the state of the chamber 12 and the cup part 161 illustrated in FIG. 11 is referred to as an "open state." The opening between the chamber lid part 122 and the chamber side wall part 214 has an annular shape centered on the central axis J1 and is thus hereinafter referred to as an "annular opening 81." In other words, in the substrate processing apparatus 1a, the annular opening 81 is formed around (i.e., on the radially outer side of) the substrate 9 by spacing the chamber lid part 122 from the chamber body 121. In step S11, the substrate 9 is conveyed into the chamber through the annular opening 81.

Figure 12:
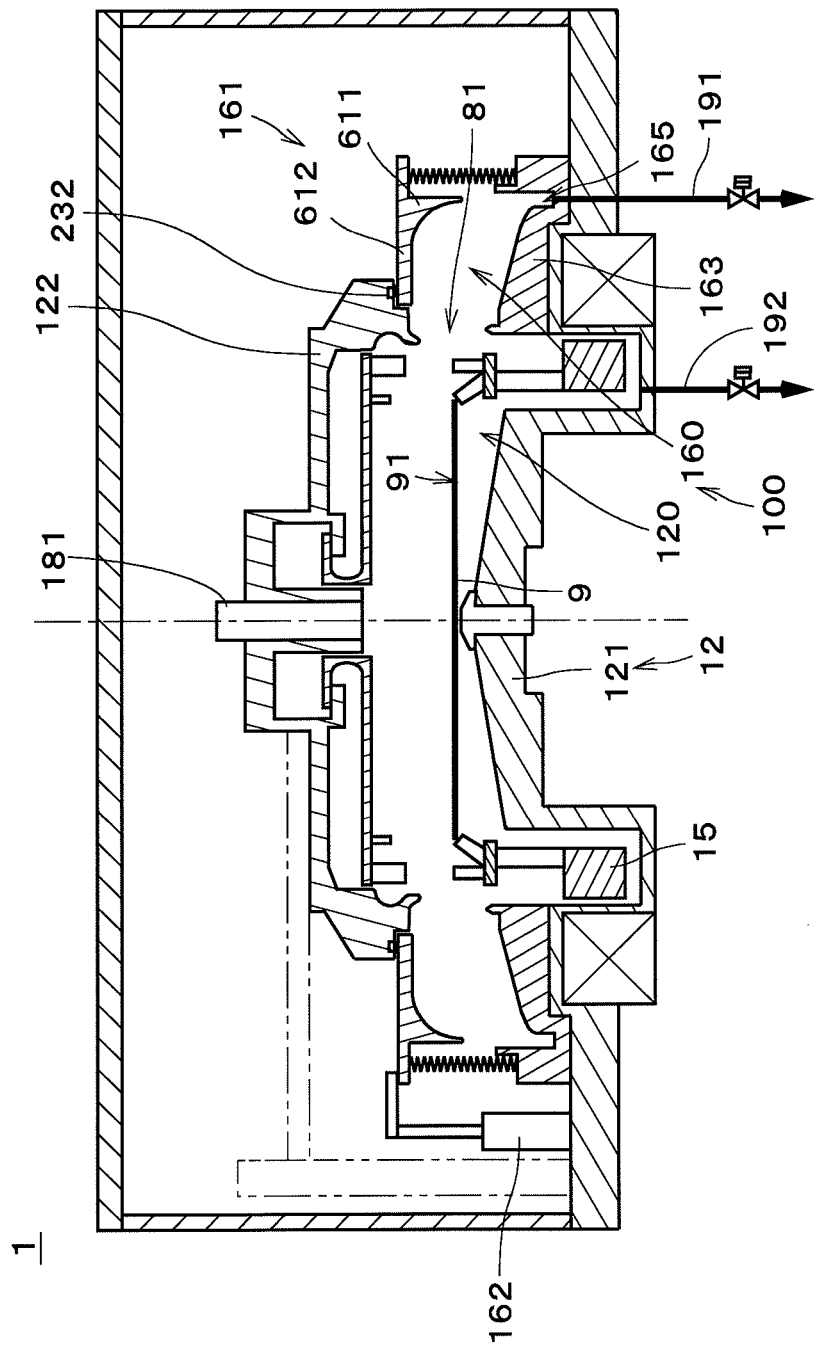
FIG. 12 is a cross-sectional view of the substrate processing apparatus in a first closed state.

When the substrate 9 has been conveyed into the chamber, the cup part 161 is moved upward from the position illustrated in FIG. 11 to the position illustrated in FIG. 12 by the cup-part movement mechanism 162 and located on the radially outer side of the annular opening 81 throughout the periphery thereof. In the following description, the state of the chamber 12 and the cup part 161 illustrated in FIG. 12 is referred to as a "first closed state" (the same applies to the state in FIG. 10). The position of the cup part 161 illustrated in FIG. 12 is referred to as a "liquid-receiving position," and the position of the cup part 161 illustrated in FIG. 11 is referred to as a "retracted position." The cup-part movement mechanism 162 moves the cup part 161 in the up-down direction between the liquid-receiving position on the radially outer side of the annular opening 81 and the retracted position that is below the liquid-receiving position.

When the cup part 161 is located at the liquid-receiving position, the side wall part 611 opposes the annular opening 81 in the radial direction. Also, the upper surface of the inner edge portion of the upper surface part 612 is in contact with the whole periphery of a lip seal 232 that is located at the lower end of the outer edge portion of the chamber lid part 122. This produces a seal part for preventing passage of gas and liquid, between the chamber lid part 122 and the upper surface part 612 of the cup part 161. As a result of the cup part 161 being located at the liquid-receiving position in the state in which the annular opening 81 is formed, a sealed space (hereinafter, referred to as an "enlarged sealed space 100") is formed which is surrounded by the chamber body 121, the chamber lid part 122, the cup part 161, and the cup opposing part 163. The enlarged sealed space 100 is one space formed by linkage of the space between the chamber lid part 122 and the chamber body 121, i.e., the chamber space 120 enlarged in the up-down direction, and the lateral space 160 surrounded by the cup part 161 and the cup opposing part 163 through the annular opening 81. The enlarged sealed space 100 may be formed by additionally using other areas as long as the enlarged sealed space 100 is formed by the area including the chamber body 121, the chamber lid part 122, and the cup part 161.

Then, the substrate rotation mechanism 15 starts rotating the substrate 9 at a constant rotational speed (a relatively low rotational speed, which is hereinafter referred to as a "stationary rotational speed"). Moreover, the supply of an inert gas (here, a nitrogen gas) from the upper nozzle 181 to the enlarged sealed space 100 is started, and the discharge of the gas in the enlarged sealed space 100 from the first discharge passage 191 is started. Thus, after a predetermined period of time has elapsed, the enlarged sealed space 100 is in an inert-gas-filled state in which the enlarged sealed space 100 is filled with the inert gas (i.e., a low oxygen atmosphere in which the oxygen concentration is low). Note that the supply of the inert gas to the enlarged sealed space 100 and the discharge of the gas in the enlarged sealed space 100 may be started in the open state illustrated in FIG. 11.

Then, a chemical solution is supplied from the chemical-solution supply part to the upper nozzle 181 and ejected toward the upper surface 91 of the substrate 9 (step S12). The chemical solution is spread to the outer periphery by the rotation of the substrate 9, and the entire upper surface 91 is covered with the chemical solution. The upper surface 91 is subjected to etching using the chemical solution. Note that the chamber 12 may be provided with a heater to heat the substrate 9 during the supply of the chemical solution.

In the enlarged sealed space 100, the chemical solution dispersed from the upper surface 91 of the rotating substrate 9 is received by the cup part 161 through the annular opening 81 and guided to the liquid receiving recessed part 165. The chemical solution guided to the liquid receiving recessed part 165 flows into the gas-liquid separator through the first discharge passage 191. The chemical solution recovered by the gas-liquid separator is reused after impurities or the like are removed from the chemical solution by a filter or the like.

The supply of the chemical solution is stopped after a predetermined period of time (e.g., 60 to 120 seconds) has elapsed since the supply of the chemical solution was started. Then, the substrate rotation mechanism 15 increases the rotational speed of the substrate 9 from the stationary rotational speed for a predetermined period of time (e.g., one to three seconds) to remove the chemical solution from the substrate 9.

Figure 13:
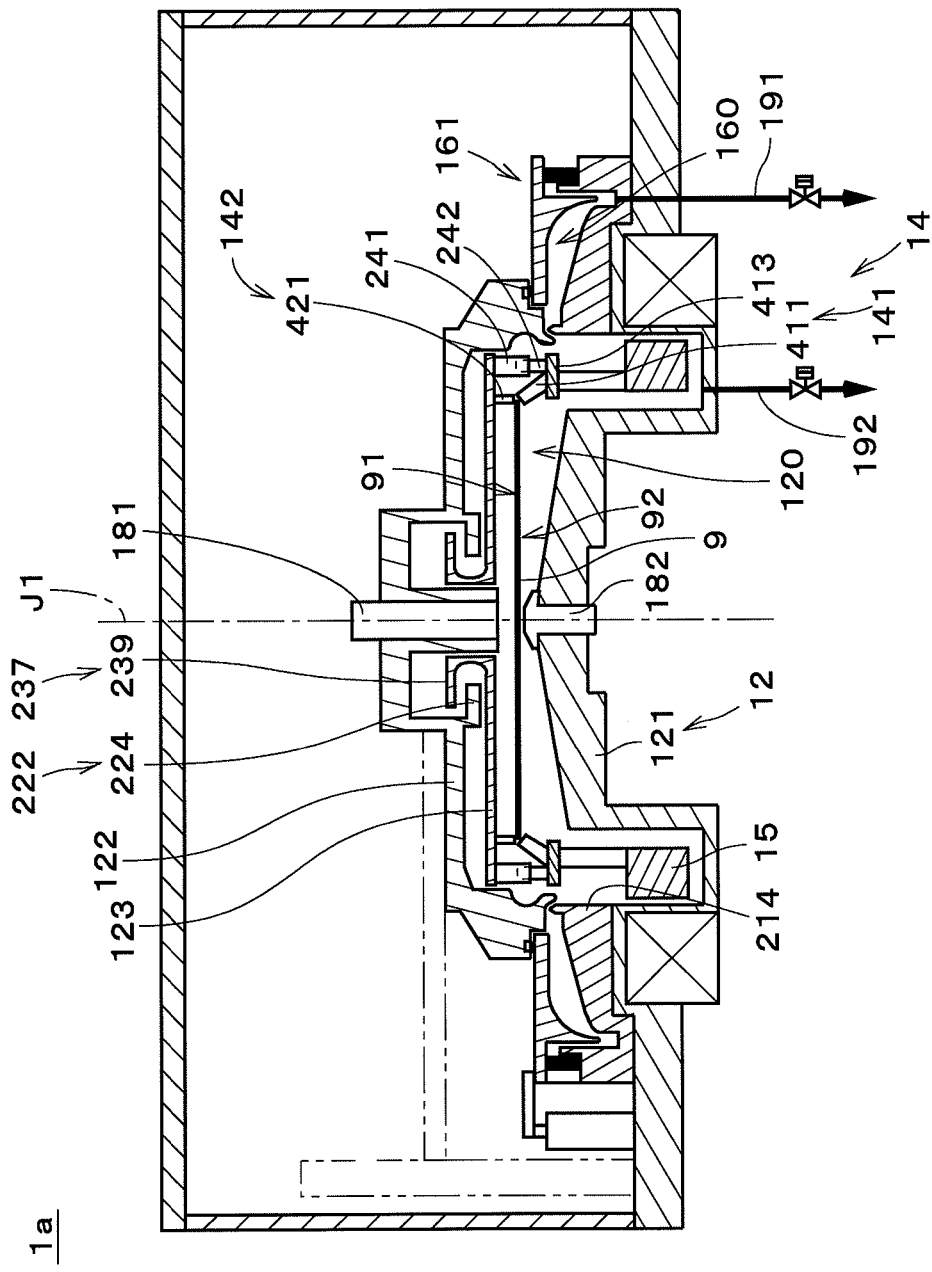
FIG. 13 is a cross-sectional view of the substrate processing apparatus in a second closed state.

The chamber lid part 122 and the cup part 161 move downward while remaining in contact with each other. Then, as illustrated in FIG. 13, the lower end of the outer edge portion of the chamber lid part 122 comes in close proximity to the upper portion of the chamber side wall part 214 with a slight gap therebetween. The annular opening 81 is thereby substantially closed, and the chamber space 120 is isolated from the lateral space 160. The cup part 161 is located at the retracted position as in FIG. 11. Hereinafter, the state of the chamber 12 and the cup part 161 illustrated in FIG. 13 is referred to as a "second closed state." In the second closed state, the substrate 9 directly opposes the inner wall of the chamber 12, and there is no other liquid receiving parts therebetween. In the second closed state, the chamber 12 is in a chamber closed state.

In the second closed state, the second contact parts 421 of the substrate pressing part 142 are in contact with the outer edge portion of the substrate 9. The lower surface of the top plate 123 and the supporter base 413 of the substrate supporter 141 have a plurality of pairs of magnets (not shown), the magnets of each pair facing each other in the up-down direction. Hereinafter, each pair of magnets is also referred to as a "magnet pair." In the substrate processing apparatus 1a, a plurality of magnet pairs are equiangularly disposed at different circumferential positions from the first contact parts 411, the second contact parts 421, the first engagement parts 241, and the second engagement parts 242. In the state in which the substrate pressing part 142 is in contact with the substrate 9, a downward force is exerted on the top plate 123 by the magnetic force (attractive force) acting between the magnet pairs.

In the substrate processing apparatus 1a, the substrate pressing part 142 presses the substrate 9 against the substrate supporter 141 with the weight of the top plate 123 and the magnetic force of the magnetic pairs. Thus, the substrate 9 can be firmly held by sandwiching the substrate 9 from above and below between the substrate pressing part 142 and the substrate supporter 141.

In the second closed state, the flange part 239 of the held part 237 is spaced above the flange part 224 of the plate holder 222, and the plate holder 222 and the held part 237 are not in contact with each other. In other words, the plate holder 222 releases hold of the top plate 123. Thus, the top plate 123 is rotated independently of the chamber lid part 122, along with the substrate holder 14 and the substrate 9 held by the substrate holder 14, by the substrate rotation mechanism 15.

In the second closed state, the second engagement parts 242 fit in the recessed portions formed in the lower portions of the first engagement parts 241. Thus, the top plate 123 is engaged with the supporter base 413 of the substrate supporter 141 in the circumferential direction about the central axis J1. In other words, the first engagement parts 241 and the second engagement parts 242 serve as a position fixing member that fixes the position of the top plate 123 relative to the substrate supporter 141 in the rotational direction. When the chamber lid part 122 moves downward, the rotational position of the supporter base 413 is controlled by the substrate rotation mechanism 15 such that the first engagement parts 241 and the second engagement parts 242 fit together.

When the chamber space 120 and the lateral space 160 are in isolation from each other, the discharge of the gas from the first discharge passage 191 is stopped, and the discharge of the gas in the chamber space 120 from the second discharge passage 192 is started. Then, the deionized-water supply part starts supplying deionized water, which is a rinsing liquid or a cleaning liquid, to the substrate 9 (step S13).

The deionized water from the deionized-water supply part is ejected from the upper nozzle 181 and the lower nozzle 182 and continuously supplied to the central portions of the upper surface 91 and the lower surface 92 of the substrate 9. The deionized water is spread to the outer peripheries of the upper surface 91 and the lower surface 92 of the substrate 9 by the rotation of the substrate 9 and dispersed from the outer peripheral edge of the substrate 9 to the outside. The deionized water dispersed from the substrate 9 is received by the inner wall of the chamber lid part 122 and discarded through the second discharge passage 192 and the gas-liquid separator (the same applies to the processing for drying the substrate 9, which will be described later). Thus, cleaning of the inside of the chamber 12 is substantially performed together with the processing for rinsing the upper surface 91 of the substrate 9 and the processing for cleaning the lower surface 92.

After a predetermined period of time has elapsed since the supply of the deionized water was started, the supply of the deionized water is stopped. Then, in the chamber space 120, the rotational speed of the substrate 9 is sufficiently increased from the stationary rotational speed. As a result, the deionized water is removed from above the substrate 9, and processing for drying the substrate 9 is performed (step S14). The rotation of the substrate 9 is stopped after a predetermined period of time has elapsed since the drying of the substrate 9 was started.

Thereafter, the chamber lid part 122 and the top plate 123 move upward, and the chamber 12 enters the open state as illustrated in FIG. 11. In step S14, liquid does not remain almost on the lower surface of the top plate 123 because the top plate 123 rotates along with the substrate supporter 141, and therefore, the liquid does not drop from the top plate 123 onto the substrate 9 during the upward movement of the chamber lid part 122. The substrate 9 is conveyed out of the chamber 12 by the external conveying mechanism (step S15). Note that, after the supply of the deionized water to the substrate 9 and before the drying of the substrate 9, IPA may be supplied from the IPA supply part to the substrate 9 to replace the deionized water.

As illustrated in FIG. 12, in the substrate processing apparatus 1a, the cup part 161 that forms the lateral space 160 around the outer periphery of the chamber 12 is provided, and the enlarged chamber space 120 and the lateral space 160 form one enlarged sealed space 100 by bringing the cup part 161 into contact with the chamber lid part 122 in the state in which the chamber lid part 122 is spaced from the chamber body 121, i.e., the annular opening 81 is formed. When the first closed state illustrated in FIG. 12 transitions to the second closed state illustrated in FIG. 13, the chamber lid part 122 and the cup part 161 move downward while remaining in contact with each other. Thus, the chamber space 120 and the lateral space 160 can be separated from each other without opening the internal space during the processing of the substrate 9.

Figure 14:
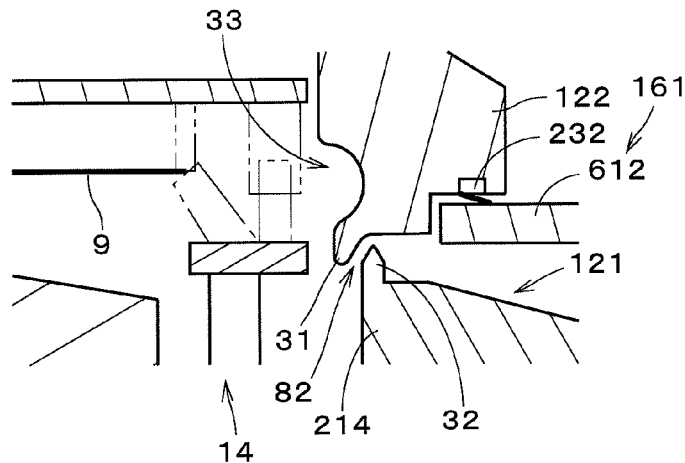
FIG. 14 is a cross-sectional view of part of the substrate processing apparatus.

FIG. 14 illustrates the vicinity of the boundary between the chamber body 121 and the chamber lid part 122 in the second closed state. The lower inner peripheral portion of the chamber lid part 122 has a lower protruding part 31 that protrudes downward. The lower protruding part 31 has an annular shape that extends throughout the periphery thereof. The lower protruding part 31 may be inclined relative to the direction of gravity as long as it protrudes downward. The position of the lower protruding part 31 in the chamber lid part 122 is not limited to the inner peripheral portion of the chamber lid part 122. In the chamber closed state, the lower end of the lower protruding part 31 is located below the substrate 9 held by the substrate holder 14.

The inner peripheral surface of the chamber lid part 122 includes an annular recessed part 33 that is located above the lower protruding part 31 and recessed radially outward. In the chamber closed state, the annular recessed part 33 is located laterally to the substrate 9 held by the substrate holder 14. Thus, the processing liquid dispersed from the substrate 9 is received by the annular recessed part 33, then flows downward along the inner peripheral surface of the chamber lid part 122, and drops from the tip of the lower protruding part 31. The presence of the annular recessed part 33 increases the flying distance of the processing liquid dispersed from the substrate 9 and suppresses re-bouncing of droplets to the substrate 9. The annular recessed part 33 preferably has a curved surface to smooth out the flow of liquid.

In the substrate processing apparatus 1a in which the dispersed processing liquid is received by the inner peripheral surface of the chamber lid part 122, the position of the chamber lid part 122 relative to the substrate 9 can be lowered, and therefore, the size of the chamber 12 in the up-down direction can be reduced. In addition, the separation and recovery of processing liquids as well as the downsizing of the chamber 12 can be achieved by using the cup part 161 located outside the chamber 12 as described previously. Note that the processing liquid that flows downward in the chamber 12 in the chamber closed state may be recovered, and the processing liquid that is received by the cup part 161 in the second closed state may be discarded. Alternatively, both of the processing liquids may be recovered.

In the substrate processing apparatus 1a, the position of the cup part 161 illustrated in FIG. 11 when the substrate 9 is conveyed in between the chamber body 121 and the chamber lid part 122 is below the position of the cup part 161 illustrated in FIG. 12 in the state in which the enlarged sealed space 100 is formed. This configuration minimizes the upward movement of the chamber lid part 122 when the substrate 9 is conveyed into the chamber 12. As a result, the size of the space required to install the substrate processing apparatus 1a in the up-down direction can be reduced to a minimum.

As illustrated in FIG. 14, the chamber body 121 includes an upper protruding part 32 that protrudes upward. The upper protruding part 32 is provided at the upper end of the chamber side wall part 214 and located on the radially outer side of the lower protruding part 31 throughout the periphery thereof. The upper end of the upper protruding part 32 is tapered upward. The position of the upper end of the upper protruding part 32 is above the position of the lower end of the lower protruding part 31. In the chamber closed state, the chamber body 121 and the chamber lid part 122 are, as described previously, in close proximity to each other in a non-contact state. There is a slight gap 82 between the lower protruding part 31 and the upper protruding part 32. The gap 82 extends upward outwardly in the radial direction.

The lower end of the lower protruding part 31 and the inner peripheral surface of the chamber side wall part 214 are sufficiently spaced from each other in the radial direction. Thus, the processing liquid that has reached the lower end of the lower protruding part 31 from the annular recessed part 33 drops without entering the gap 82. Preferably, the lower protruding part 31 extends radially inward of the inner peripheral surface of the chamber body 121.

In the chamber closed state, the lower protruding part 31 covers the radially inner side of the gap 82. This configuration also prevents the dispersed processing liquid from directly reaching and entering the gap 82. Preventing the entry of the processing liquid into the gap 82 prevents the processing liquid from solidifying and becoming the source of particles. Note that it is sufficient for the lower protruding part 31 to cover the radially inner side of the gap 82 when viewed from the substrate 9, and the opening of the gap 82 may be exposed when viewed in the direction perpendicular to the central axis J1.

Due to the presence of the gap 82, in the chamber closed state, the discharge of the gas in the cup part 161 from the first discharge passage 191 illustrated in FIG. 13 is stopped when the processing liquid is supplied to the rotating substrate 9. The discharge of the gas and processing liquid in the chamber body 121 from the second discharge passage 192 continues in principle. Thus, the entry of the processing liquid into the gap 82 is more reliably suppressed. Even if the processing liquid enters the gap 82, the amount of adhesion of the processing liquid can be reduced because the upper end of the lower protruding part 31 is tapered upward.

In the state in which the chamber lid part 122 and the cup part 161 are in contact with the each other via the lip seal 232, the position of the lower surface of the inner peripheral portion of the upper surface part 612 is above the position of the lower end of the lower protruding part 31. This reduces the possibility that the chemical solution may adhere between the chamber lid part 122 and the cup part 161 in the first closed state illustrated in FIG. 12.

Figure 15:
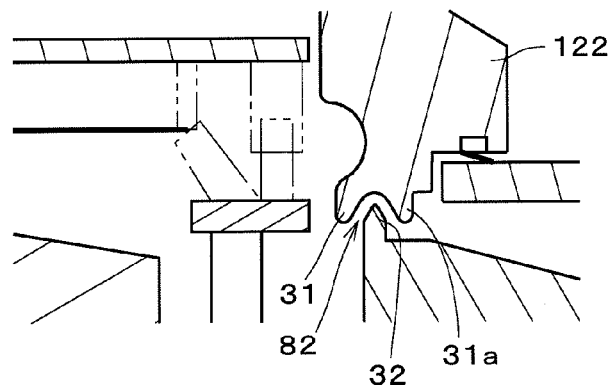
FIG. 15 is a cross-sectional view illustrating another example of part of the substrate processing apparatus.

FIG. 15 illustrates another example of the lower portion of the chamber lid part 122. In FIG. 15, the lower portion of the chamber lid part 122 has another lower protruding part 31a. Hereinafter, this lower protruding part 31a is referred to as an "additional lower protruding part 31a." The structure of the other area of the chamber lid part 122 is similar to that in FIG. 14. The additional lower protruding part 31a is located on the radially outer side of the upper protruding part 32 and protrudes downward throughout the periphery thereof. The position of the lower end of the additional lower protruding part 31a is below the position of the upper end of the upper protruding part 32. The gap 82 is formed by the lower protruding part 31, the upper protruding part 32, and the additional lower protruding part 31a. Thus, the gap 82 extends once upward outwardly in the radial direction and then extends downward.

The gap 82 having a more complicated labyrinth structure further suppresses moves of extremely fine droplets of the processing liquid to the outside of the chamber space 120.

Figure 16:
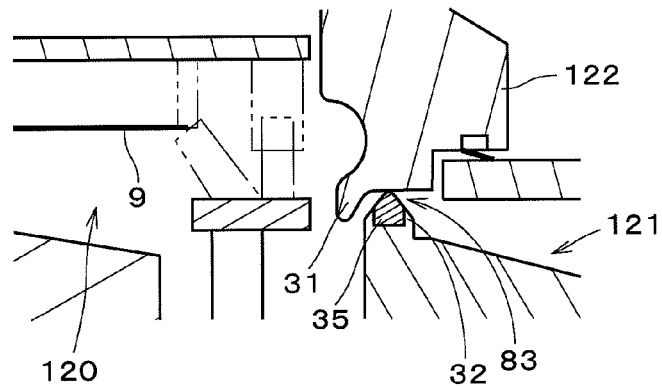
FIG. 16 is a cross-sectional view illustrating yet another example of part of the substrate processing apparatus.

FIG. 16 illustrates another example of the upper protruding part 32. The upper end of the upper protruding part 32 in FIG. 16 is in contact with the lower portion of the chamber lid part 122 in the chamber closed state. In other words, the chamber lid part 122 is in contact with the upper opening of the chamber body 121 in the chamber closed state. This makes the chamber space 120 a sealed space. Thus, the pressure in the chamber space 120 can be reduced during the processing of the substrate 9. For example, processing for drying the substrate 9 may be performed in a reduced pressure atmosphere that is lower than atmospheric pressure.

To achieve sealing of the chamber space 120, the upper portion of the upper protruding part 32 includes an elastic seal member 35 that is molded of a resin. Alternatively, the area of the chamber lid part 122 that is in contact with the upper end of the upper protruding part 32 may include the elastic seal member 35 as illustrated in FIG. 17.

Figure 17:
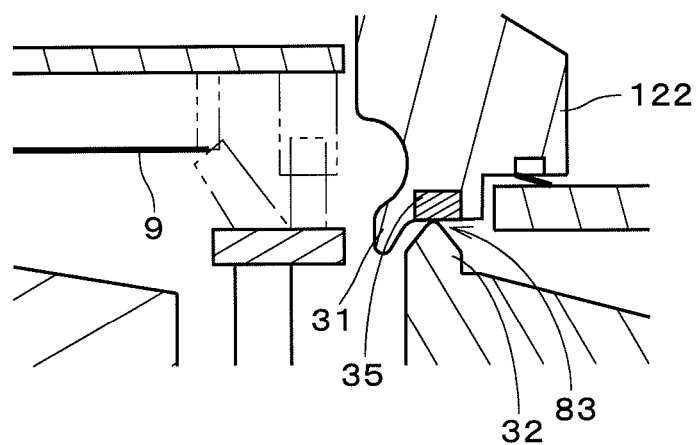
FIG. 17 is a cross-sectional view illustrating yet another example of part of the substrate processing apparatus.

In FIGS. 16 and 17, the structures of the other areas of the chamber body 121 and the chamber lid part 122 are similar to those in FIG. 14. In the chamber closed state, the lower protruding part 31 covers the radially inner side of a boundary 83 between the chamber lid part 122 and the chamber body 121. It is thus possible to suppress generation of particles and achieve recovery of processing liquids while reducing the size of the chamber 12.

The substrate processing apparatuses 1 and 1a described above can be modified in various ways.

The substrate processing apparatus 1 does not necessarily have to include the aforementioned labyrinth structure, and for example, a configuration is possible in which the lower end of the guard part 166 and the upper end of the liquid receiving side wall part 253 are located at approximately the same position in the up-down direction in the state in which the space forming lid part is located at the second position. Alternatively, the lower end of the guard part 166 may be located above the upper end of the liquid receiving side wall part 253 as long as the guard part 166 substantially covers the gap between the lower end of the cup side wall part 611 and the upper end of the liquid receiving side wall part 253.

In the substrate processing apparatus 1, the enlarged sealed space 100 formed by the chamber lid part 122, the cup part 161, the outer side wall part 164, and the chamber body 121 does not necessarily have to be a strictly airtight sealed space. The outer side wall part 164 is not limited to a bellows, and other various members (e.g., a member that becomes elastically deformed into a radially outwardly protruding shape as the height in the up-down direction decreases) may be used as the outer side wall part 164.

In the substrate processing apparatus 1, a nozzle that is fixed within the lateral space 160 may be provided, instead of the scan nozzle 188, and used to eject the processing liquid diagonally downward through the annular opening 81 and supply the processing liquid to the upper surface 91 of the substrate 9.

In the substrate processing apparatus 1, the aforementioned space forming lid part does not necessarily have to include the chamber lid part 122 and the cup part 161 that move independently of each other in the up-down direction, and the chamber lid part 122 and the cup part 161 may be formed as an integral member. In this case, for example, the inner lid side wall part may be omitted from the space forming lid part.

In the substrate processing apparatus 1a, the annular recessed part 33 may be omitted, for example. The upper protruding part 32 may also be omitted. The labyrinth structure formed by, for example, the lower protruding part 31 and the upper protruding part 32 may be a more complicated structure.

The processing performed by the substrate processing apparatus 1a is not limited to the processing described in the above embodiments. In the case where the chamber space 120 can be sealed, the substrate processing apparatus 1a may include a pressure application part for supplying gas to the chamber space 120 and applying pressure thereto.

In the substrate processing apparatuses 1 and 1a, the chamber opening-and-closing mechanism 131 does not necessarily have to move the chamber lid part 122 in the up-down direction, and may move the chamber body 121 in the up-down direction while the chamber lid part 122 is fixed. The chamber 12 is not limited to having a generally cylindrical shape, and may be of various shapes.

In the substrate processing apparatuses 1 and 1a, the shapes and structures of the stator 151 and the rotor 152 of the substrate rotation mechanism 15 may be modified in various ways. The rotor 152 does not necessarily have to rotate in a floating state, and may rotate along a structure such as a guide that is provided in the chamber 12 and mechanically supports the rotor 152. The substrate rotation mechanism 15 does not necessarily have to be a hollow motor, and an axial rotary motor may be used as a substrate rotation mechanism.

In the substrate processing apparatuses 1 and 1a, the enlarged sealed space 100 may be formed by bringing the portion of the cup part 161 other than the upper surface part 612, e.g., the side wall part 611, into contact with the chamber lid part 122. The structure of the liquid receiving part 16 may be appropriately changed. For example, another cup part may be provided inside the cup part 161.

In the substrate processing apparatuses 1 and 1a, the shapes of the upper nozzle 181 and the lower nozzle 182 are not limited to protruding shapes. Any portion that includes an ejection port for ejecting processing liquids is included in the concept of ejection parts according to the above-described embodiments.

The substrate processing apparatuses 1 and 1*a* may be used to process substrates other than semiconductor substrates, such as glass substrates used in display devices including liquid crystal displays, plasma displays, and field emission displays (FEDs). The substrate processing apparatuses 1 and 1*a* may also be used to process substrates such as optical disk substrates, magnetic disk substrates, magneto-optical disk substrates, photomask substrates, ceramic substrates, and solar-cell substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

REFERENCE SIGNS LIST 1, 1*a* Substrate processing apparatus
9 Substrate
12 Chamber
14 Substrate holder
15 Substrate rotation mechanism
31 Lower protruding part
32 Upper protruding part
33 Annular recessed part
81 Annular opening
82 Gap
83 Boundary
100 Enlarged sealed space
120 Chamber space
121 Chamber body
122 Chamber lid part
131 Chamber opening-and-closing mechanism
160 Lateral space
161 Cup part
162 Cup-part movement mechanism
164 Outer side wall part (bellows)
166 Guard part
181 Upper nozzle (processing-liquid ejection part)
182 Lower nozzle
188 Scan nozzle
191 First discharge passage
192 Second discharge passage
228 Lid lower tubular part
253 Liquid receiving side wall part
611 Cup side wall part
813 Chemical-solution supply part
814 Deionized-water supply part
815 IPA supply part
J1 Central axis
S11 to S15 Step

The invention claimed is:
1. A substrate processing apparatus for processing a substrate, comprising:
a space forming main body having a tubular main body side wall part;
a space forming lid part having a tubular lid side wall part located on a radially inner side of said main body side wall part and for covering a top of said space forming main body;
a space-forming-part movement mechanism including an elevator, said elevator being operable for moving said space forming lid part relative to said space forming main body in an up-down direction between a first position and a second position that is above said first position;
an outer side wall part located on a radially outer side of said main body side wall part, having an upper end portion connected to said space forming lid part and a lower end portion connected to said space forming main body, and becoming deformed following the relative movement caused by said space-forming-part movement mechanism;
a tubular guard part disposed between said lid side wall part and said main body side wall part;
a substrate supporter disposed within said space forming main body and supporting an outer edge portion of a substrate held in a horizontal position from an underside of said substrate;
a substrate rotation mechanism including a motor, said motor being operable for rotating said substrate along with said substrate supporter; and
a processing liquid supply part including a nozzle for supplying a processing liquid to said substrate,
in a state in which said space forming lid part is located at said first position, said lid side wall part and said main body side wall part overlap each other in a radial direction, and said guard part is supported by said main body side wall part,
when said space forming lid part moves from said first position to said second position, said guard part moves upward along with the movement of said space forming lid part, and
in a state in which said space forming lid part is located at said second position, a lower end of said lid side wall part is located above an upper end of said main body side wall part, and said guard part covers a gap between said lower end of said lid side wall part and said upper end of said main body side wall part.

2. The substrate processing apparatus according to claim 1, wherein
when said space forming lid part moves from said first position to said second position, said guard part moves upward while being suspended from said lid side wall part.

3. The substrate processing apparatus according to claim 1, wherein
said outer side wall part is a bellows in which a plurality of peripherally extending mountain-fold lines and a plurality of peripherally extending valley-fold lines are alternately arranged in said up-down direction.

4. The substrate processing apparatus according to claim 1, wherein
in the state in which said space forming lid part is located at said second position, a lower end portion of said guard part overlaps with an upper end portion of said main body side wall part in the radial direction.

5. The substrate processing apparatus according to claim 1, wherein
said space forming lid part has a tubular part located on a radially inner side of said lid side wall part,
in the state in which said space forming lid part is located at said first position, said tubular part is in contact with said space forming main body, forming an internal sealed space, and
in the state in which said space forming lid part is located at said second position, said tubular part is spaced from said space forming main body, forming an annular opening between said tubular part and said space forming main body, and said lid side wall part receives a processing liquid dispersed from said substrate through said annular opening.

6. The substrate processing apparatus according to claim 5, wherein
said nozzle is attached to said space forming lid part between said tubular part and said lid side wall part and moves to above said substrate through said annular opening to supply the processing liquid to said substrate.

7. A substrate processing apparatus for processing a substrate, comprising:
a chamber including a chamber body and a chamber lid part and forming a chamber space in a chamber closed state in which said chamber lid part is in close proximity to or in contact with an upper opening of said chamber body;
a chamber opening-and-closing mechanism including an elevator, said elevator being operable for moving said chamber lid part relative to said chamber body in an up-down direction;
a substrate holder including a chuck, said chuck being located in said chamber space in said chamber closed state and holding a substrate in a horizontal position while in contact with an outer edge portion of said substrate;
a substrate rotation mechanism including a motor, said motor being operable for rotating said substrate along with said substrate holder about a central axis pointing in the up-down direction;
a processing liquid ejection part including a nozzle for supplying a processing liquid to said substrate; and
a cup part located outside said chamber throughout a periphery thereof, forming a lateral space along the periphery of said chamber, and receiving a processing liquid dispersed from said substrate that is being rotated, through an annular opening that is formed around said substrate by spacing said chamber lid part from said chamber body,
wherein a lower portion of said chamber lid part includes a lower protruding part that protrudes downward throughout a periphery thereof,
in said chamber closed state, a lower end of said lower protruding part is located below the substrate held by said substrate holder, and said lower protruding part covers a radially inner side of a gap or boundary between said chamber lid part and said chamber body, and
an area that includes said chamber body, said chamber lid part, and said cup part forms one enlarged sealed space when said cup part is in contact with said chamber lid part in a state in which said annular opening is formed.

8. The substrate processing apparatus according to claim 7, wherein
said chamber lid part includes an annular recessed part that is located above said lower protruding part and recessed radially outward, and
in said chamber closed state, said annular recessed part is located laterally to the substrate held by said substrate holder.

9. The substrate processing apparatus according to claim 7, wherein
said chamber body includes an upper protruding part that protrudes upward on a radially outer side of said lower protruding part throughout a periphery thereof, and
an upper end of said upper protruding part is tapered upward.

10. The substrate processing apparatus according to claim 7, further comprising:
a first discharge passage for discharging gas in said cup part; and
a second discharge passage for discharging gas in said chamber,
wherein the discharge of gas from said first discharge passage is stopped when said chamber body and said chamber lid part are in close proximity to each other without being in contact with each other in said chamber closed state and a processing liquid is supplied to the substrate that is being rotated.

11. The substrate processing apparatus according to claim 7, wherein
said chamber body includes an upper protruding part that protrudes upward on a radially outer side of said lower protruding part,
in said chamber closed state, an upper end of said upper protruding part is in contact with said chamber lid part, and
an upper portion of said upper protruding part or an area of said chamber lid part that is in contact with an upper end of said upper protruding part includes an elastic seal member.

12. The substrate processing apparatus according to claim 7, further comprising:
a cup-part movement mechanism including a cup elevator, said cup elevator being operable for moving said cup part in the up-down direction,
wherein a position of said chamber body is fixed, and
a position of said cup part when a substrate is conveyed in between said chamber body and said chamber lid part is lower than a position of said cup part in a state in which said enlarged sealed space is formed.

* * * * *